(12) United States Patent
Yamada

(10) Patent No.: US 9,088,264 B2
(45) Date of Patent: Jul. 21, 2015

(54) RESONATOR ELEMENT, RESONATOR, OSCILLATOR, ELECTRONIC DEVICE, AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/224,395

(22) Filed: Mar. 25, 2014

(65) Prior Publication Data

US 2014/0292432 A1   Oct. 2, 2014

(30) Foreign Application Priority Data

Mar. 29, 2013   (JP) ................. 2013-075384

(51) Int. Cl.
| | |
|---|---|
| *G04F 5/06* | (2006.01) |
| *H03B 5/32* | (2006.01) |
| *H03H 9/21* | (2006.01) |
| *H03H 9/05* | (2006.01) |
| *H03H 9/10* | (2006.01) |
| *H03H 9/215* | (2006.01) |
| *H03H 3/04* | (2006.01) |

(52) U.S. Cl.
CPC ............ *H03H 9/0547* (2013.01); *G04F 5/063* (2013.01); *H03H 9/1021* (2013.01); *H03H 9/215* (2013.01); *H03B 5/32* (2013.01); *H03H 2003/0492* (2013.01)

(58) Field of Classification Search
CPC ............ G04F 5/04; G04F 5/06; G04F 5/063; H03B 5/30; H03B 5/32; H03H 9/21; H03H 9/215; H03H 9/2468; H03H 9/2473; H03H 9/2478; H03H 9/2484; H03H 9/2489; H03H 9/2494; H03H 2003/026; H03H 2003/0492
USPC .......... 310/311, 312, 348, 370; 331/154, 156, 331/158
See application file for complete search history.

(56) References Cited

U.S. PATENT DOCUMENTS

| | | | |
|---|---|---|---|
| 3,493,292 A * | 2/1970 | Dostal ........................ | 359/230 |
| 7,084,556 B1 * | 8/2006 | Dalla Piazza et al. ........ | 310/370 |
| 8,922,286 B2 * | 12/2014 | Yamada et al. .............. | 331/154 |
| 2002/0125794 A1 | 9/2002 | Tanaya et al. | |
| 2003/0080652 A1 | 5/2003 | Kawashima | |
| 2009/0021120 A1 | 1/2009 | Dalla Piazza et al. | |
| 2011/0001394 A1 * | 1/2011 | Dalla Piazza et al. ........ | 310/325 |
| 2011/0018399 A1 * | 1/2011 | Murata et al. ................ | 310/346 |
| 2011/0221311 A1 | 9/2011 | Iwai | |

(Continued)

FOREIGN PATENT DOCUMENTS

| | | |
|---|---|---|
| JP | A-2002-280870 | 9/2002 |
| JP | A-2003-273699 | 9/2003 |

(Continued)

*Primary Examiner* — Levi Gannon
(74) *Attorney, Agent, or Firm* — Oliff PLC

(57) ABSTRACT

A resonator includes: a resonator element including a base portion, and a pair of vibrating arms which are integrally provided with the base portion, extend in a first direction from the base portion, and are arranged in a second direction orthogonal to the first direction; a base which supports the resonator element; and a fixing portion which fixes the resonator element with respect to the base, and the resonator element is configured so as to satisfy conditions shown by the following formula (1).

$$Q_{Ln} < Q_1 \frac{f_n}{f_1} \left( \frac{L_1}{L_n} - 1 \right)^{-1}. \quad (1)$$

12 Claims, 13 Drawing Sheets

(56) References Cited

U.S. PATENT DOCUMENTS

2012/0098389 A1* 4/2012 Dalla Piazza et al. ........ 310/348
2014/0241132 A1* 8/2014 Tamura ........................... 368/47

FOREIGN PATENT DOCUMENTS

| JP | A-2003-273701 | 9/2003 |
|----|---------------|--------|
| JP | A-2003-273703 | 9/2003 |
| JP | A-2007-60729  | 3/2007 |
| JP | A-2007-295605 | 11/2007 |
| JP | A-2009-27711  | 2/2009 |
| JP | A-2011-14977  | 1/2011 |
| JP | A-2011-19159  | 1/2011 |
| JP | A-2011-160391 | 8/2011 |
| JP | A-2011-166324 | 8/2011 |
| JP | A-2011-166325 | 8/2011 |
| JP | A-2011-216924 | 10/2011 |
| JP | A-2013-5424   | 1/2013 |

* cited by examiner

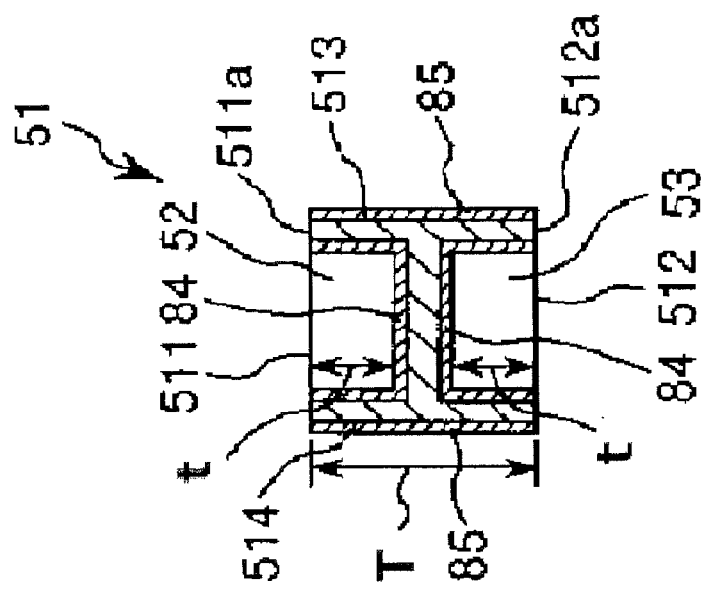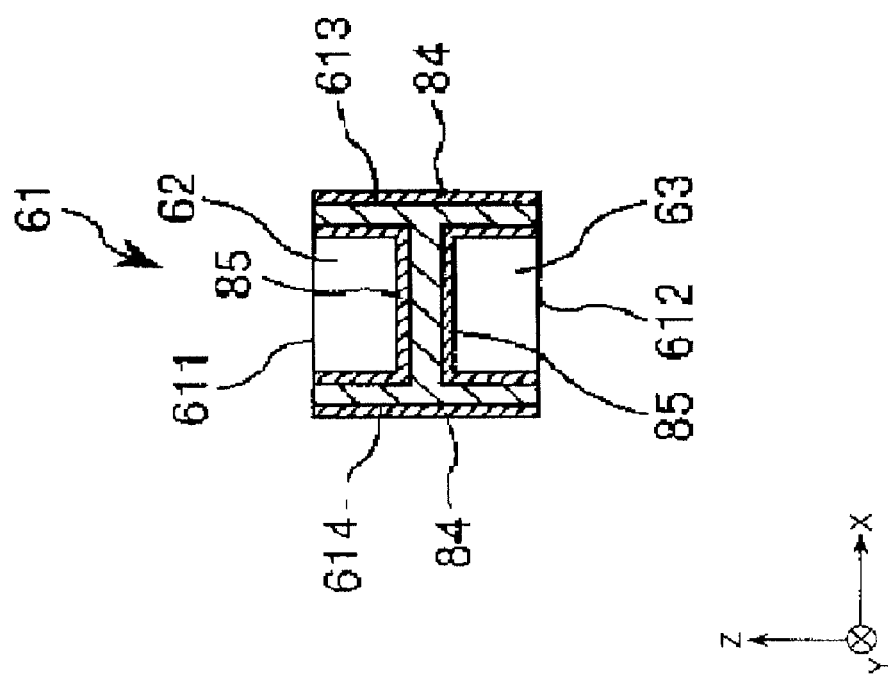
FIG. 4

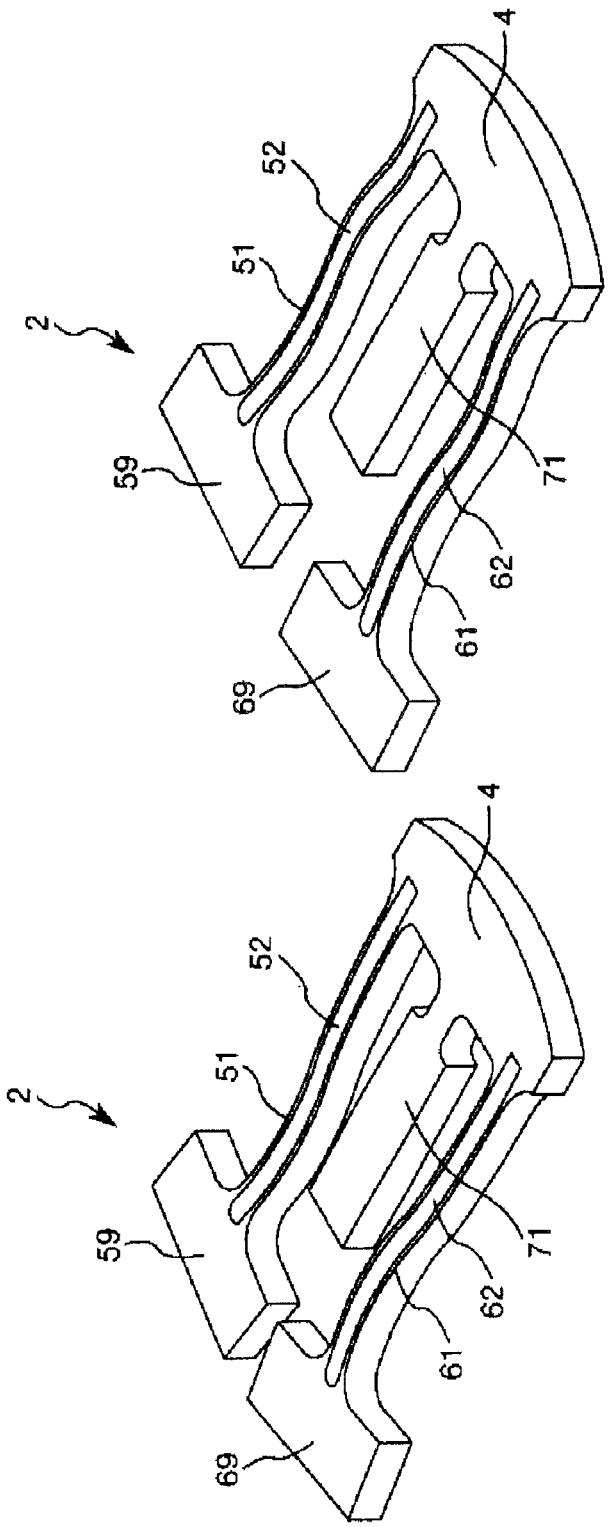

RESONATOR ELEMENT, RESONATOR, OSCILLATOR, ELECTRONIC DEVICE, AND MOVING OBJECT

BACKGROUND

1. Technical Field

The present invention relates to a resonator element, a resonator, oscillator, an electronic device, and a moving object.

2. Related Art

A resonator using quartz crystal has been known from the related art (for example, see JP-A-2007-60729 and JP-A-2011-19159). Such a resonator element has excellent frequency-temperature characteristics, and therefore is widely used as a reference frequency source or a transmission source of various electronic devices.

A resonator element of a resonator disclosed in JP-A-2007-60729 is a tuning fork type and includes a base portion and a pair of vibrating arms which extend from the base portion. A pair of grooves are formed on an upper surface and a lower surface of each vibrating arm. A length of each groove is set so as to be 20% to 68% with respect to the entire length of the resonator element. With such a configuration, equivalent series resistance $R_1$ of the resonator element which vibrates in a fundamental mode may be set to be smaller than equivalent series resistance $R_2$ in a second harmonic mode.

However, by setting the length of the groove in the range described above, an electric-field area for exciting the fundamental mode is reduced by an amount of a decreased proportion of the length of the groove with respect to the length of the resonator element, and as a result, the equivalent series resistance $R_1$ is increased.

A resonator element of a resonator disclosed in JP-A-2011-19159 is also a tuning fork type and includes a base portion and a pair of vibrating arms which extend from the base portion. Each vibrating arm includes an arm portion on which a pair of grooves opened to an upper surface and a lower surface thereof are formed, and a hammerhead (weight portion) provided on the arm portion on a side opposite the base portion. A width of the hammerhead is set to be equal to or more than double the width of the arm portion and a length of the hammerhead is set to be equal to or greater than 30% of the length of the vibrating arm, and accordingly vibration in the second harmonic mode which is an unnecessary wave mode may be suppressed.

However, since a proportion of the hammerhead in the resonator element is set to be great, $R_1$ increases as a Q value of the resonator element decreases, in a range of the length of the hammerhead which exceeds 41% of the length of the vibrating arm. Even in a range of the length of the hammerhead which is 30% to 41% of the length of the vibrating arm, the length of the arm portion on which the groove is formed is small and the electric-field area for exciting the fundamental mode is small, and accordingly an electric-field effect is decreased and the equivalent series resistance $R_1$ increases.

As described above, in the resonator element of the related art, it was difficult to suppress the increase of the equivalent series resistance $R_1$ and to set the equivalent series resistance $R_1$ to be smaller than the equivalent series resistance $R_2$ in the unnecessary wave mode. That is, in the resonator element of the related art, it was difficult to satisfy both the reduction of a concern of a false operation in which an oscillator with the resonator element loaded thereon oscillates at a resonance frequency in the unnecessary wave mode, and the decrease of the equivalent series resistance $R_1$.

SUMMARY

An advantage of some aspects of the invention is to provide a resonator element which reduces an unnecessary wave mode and exhibits an excellent vibration property in a flexural vibration mode of a fundamental wave, and a resonator, an oscillator, an electronic device, and a moving object with such a resonator element loaded thereon.

The invention can be implemented as the following application examples.

Application Example 1

This application example is directed to a resonator element including: a vibration piece including a base portion, and a pair of vibrating arms which, in a plan view, extend in a first direction from the base portion, are arranged in a second direction orthogonal to the first direction, and alternately repeat between approach and separation from each other along the second direction to perform the flexural vibration, in which conditions shown by the following formula (1) are satisfied.

$$Q_{Ln} < Q_1 \frac{f_n}{f_1}\left(\frac{L_1}{L_n} - 1\right)^{-1} \tag{1}$$

Herein, $Q_{Ln}$ represents a Q value acquired by considering only vibration leakage in an n-th harmonic flexural vibration mode, $Q_1$ represents a Q value in a fundamental flexural vibration mode, $L_n$ represents equivalent inductance in the n-th harmonic flexural vibration mode, $L_1$ represents equivalent inductance in the fundamental flexural vibration mode, $f_n$ represents a resonance frequency in the n-th harmonic flexural vibration mode, $f_1$ represents a resonance frequency in the fundamental flexural vibration mode, and n represents a natural number of equal to or greater than 2.

With this configuration, it is possible to suppress an increase of a value of equivalent series resistance $R_1$ in the fundamental flexural vibration mode, and to set a value of equivalent series resistance $R_n$ in the n-th harmonic flexural vibration mode to be greater than the value of the equivalent series resistance $R_1$ in the fundamental flexural vibration mode. Accordingly, it is possible to reduce vibration in the n-th harmonic flexural vibration mode, and thus, it is possible to obtain a resonator element which exhibits an excellent vibration property, and a concern of a false operation in which an oscillator with this resonator element loaded thereon oscillates at a resonance frequency in the n-th harmonic flexural vibration mode, is reduced.

Application Example 2

In the resonator element of the application example of the invention, it is preferable that, when a Q value in an n-th harmonic flexural vibration mode is set as $Q_n$, $Q_{Ln}^{-1}/Q_n^{-1}$ is equal to or greater than 0.5.

As described above, by setting a proportion of a loss due to vibration leakage in the n-th harmonic flexural vibration mode with respect to the entire loss in the n-th harmonic flexural vibration mode to be equal to or greater than 50%, it is possible to more reliably suppress the increase of the value of the equivalent series resistance $R_1$ in the fundamental flexural vibration mode, and to set the equivalent series resistance $R_n$ in the n-th harmonic flexural vibration mode to be greater than $R_1$.

Application Example 3

In the resonator element of the application example of the invention, it is preferable that, when a Q value in an n-th harmonic flexural vibration mode is set as $Q_n$, $Q_n/Q_1$ is equal to or smaller than 1.

Accordingly, it is possible to set the Q value in the fundamental flexural vibration mode to be reliably greater than the Q value acquired by considering only the vibration leakage in the harmonic flexural vibration mode.

In a tuning fork type resonator element of the related art, since a proportion of a thermoelastic loss with respect to the entire loss in each mode of the fundamental flexural vibration mode and the n-th harmonic flexural vibration mode is great, the Q value ($Q_n$) in the n-th harmonic flexural vibration mode with a high frequency necessarily becomes greater than the Q value ($Q_1$) in the fundamental flexural vibration mode, as will be clear from formula (10) which will be described later. As a result, the equivalent series resistance $R_n$ in the n-th harmonic flexural vibration mode becomes smaller than the equivalent series resistance $R_1$ in the fundamental flexural vibration mode, but by setting $Q_n$ to be equal to or smaller than $Q_1$, that is, by setting the loss in the n-th harmonic flexural vibration mode to be equal to or greater than the loss in the fundamental flexural vibration mode, it is possible to more reliably suppress the increase of the value of the equivalent series resistance $R_1$ in the fundamental flexural vibration mode, and to set the equivalent series resistance $R_n$ in the n-th harmonic flexural vibration mode to be greater than $R_1$.

Application Example 4

In the resonator element of the application example of the invention, it is preferable that, when a thermal relaxation frequency is set as $f_{m0}$, $f_{m0}^2/f_1^2$ is equal to or smaller than 0.05.

Accordingly, it is possible to obtain a resonator element having a higher Q value in a heat insulating region (which will be described later).

In addition, in the resonator element of the application example of the invention, it is preferable that the resonator element satisfies conditions shown by the following formula (2).

$$Q_{L2} < Q_1 \frac{f_2}{f_1} \left( \frac{L_1}{L_2} - 1 \right)^{-1} \quad (2)$$

Accordingly, it is possible to acquire a high Q value in the fundamental flexural vibration mode, to set the equivalent series resistance in the fundamental flexural vibration mode to be smaller than equivalent series resistance in a second harmonic flexural vibration mode, and to obtain a resonator element which exhibits an excellent vibration property. Particularly, an oscillation false operation easily occurs as the second harmonic flexural vibration mode is a harmonic flexural vibration mode with a resonance frequency closest to that of the fundamental flexural vibration mode, and therefore, with the configuration described above, a concern about the false operation of the oscillator with the resonator element loaded thereon is decreased.

In addition, in the resonator element of the invention, it is preferable that the resonator element satisfies conditions shown by the following formula (3).

$$Q_{L3} < Q_1 \frac{f_3}{f_1} \left( \frac{L_1}{L_3} - 1 \right)^{-1} \quad (3)$$

Accordingly, it is possible to acquire a high Q value in the fundamental flexural vibration mode, to set the equivalent series resistance in the fundamental flexural vibration mode to be smaller than the equivalent series resistance in a third harmonic flexural vibration mode, and to obtain a resonator element which exhibits an excellent vibration property. Particularly, an oscillation false operation easily occurs as the third harmonic flexural vibration mode is a harmonic flexural vibration mode with a resonance frequency close to that of the fundamental flexural vibration mode, subsequent to the second harmonic flexural vibration mode, and has small equivalent series resistance thereof as the thermoelastic loss is extremely small due to the resonance frequency which is higher than that of the second harmonic flexural vibration mode. Therefore, with the configuration described above, a concern about the false operation of the oscillator with the resonator element loaded thereon is decreased.

In addition, in the resonator element of the invention, it is preferable that the resonator element is configured so as to satisfy the conditions shown by formula (1) by setting at least one of a storage elastic modulus of a material of a fixing material for attaching the resonator element to a base substrate, a loss elastic modulus of a material configuring the fixing material, the number of disposed fixing materials, a position of the fixing material with respect to the resonator element, and a size of the fixing material with respect to the resonator element.

Accordingly, it is possible to acquire a high Q value in the fundamental flexural vibration mode, to set the equivalent series resistance in the fundamental flexural vibration mode to be smaller than equivalent series resistance in the n-th harmonic flexural vibration mode (n is a natural number equal to or larger than 2), and to obtain a resonator element which exhibits an even more excellent vibration property in the fundamental flexural vibration mode.

Application Example 5

In the resonator element of the application example of the invention, it is preferable that the resonator element further includes a support arm which is disposed between the pair of vibrating arms in a plan view, and extends along the first direction from the base portion, and the support arm is attached to a base with a fixing material.

Accordingly, it is possible to effectively reduce the vibration leakage of the resonator element in the fundamental flexural vibration mode.

Application Example 6

In the resonator element of the application example of the invention, it is preferable that a groove is provided on at least one of a pair of main surfaces of the vibrating arm which have a front-rear relationship.

Accordingly, a great difference occurs between rigidity of the vibrating arm and rigidity of the base portion, mass of the base portion with respect to the vibrating arm is relatively increased, and the flexural vibration of the vibrating arm is hardly transferred to the base portion, and therefore, it is possible to more effectively reduce the vibration leakage of the resonator element in the fundamental flexural vibration mode.

Application Example 7

In the resonator element of the application example of the invention, it is preferable that the vibrating arm includes a weight portion, and an arm portion which is disposed between the weight portion and the base portion in a plan view.

By containing the weight portion as described above, since it is possible to expand the width of the arm portion (length in the second direction) so as to constantly maintain the resonance frequency in the fundamental flexural vibration mode by an amount of increased weight of the vibrating arm on a distal end side, and accordingly a flow path through which heat generated in the arm portion at the time of the flexural vibration becomes longer and it is possible to reduce the thermoelastic loss of the resonator element.

Application Example 8

In the resonator element of the application example of the invention, it is preferable that the weight portion includes a wide width portion having a greater width along the second direction than that of the arm portion.

By containing the wide width portion as described above, since it is possible to expand the width of the arm portion (length in the second direction) so as to constantly maintain the resonance frequency in the fundamental flexural vibration mode by an amount of increased weight of the vibrating arm on the distal end side with the expanded width, and accordingly the flow path through which heat generated in the arm portion at the time of the flexural vibration becomes longer and it is possible to reduce the thermoelastic loss of the resonator element.

Application Example 9

This application example is directed to a resonator including: the resonator element according to the application example; and a base on which the resonator element is loaded.

Accordingly, it is possible to obtain a resonator having high reliability.

Application Example 10

This application example is directed to an oscillator including: the resonator element according to the application example; and a circuit.

Accordingly, it is possible to obtain an oscillator having high reliability.

Application Example 11

This application example is directed to an electronic device including the resonator element according to the application example of the invention.

Accordingly, it is possible to obtain an electronic device having high reliability.

Application Example 12

This application example is directed to a moving object including the resonator element according to the application example of the invention.

Accordingly, it is possible to obtain a moving object having high reliability.

BRIEF DESCRIPTION OF THE DRAWINGS

The invention will be described with reference to the accompanying drawings, wherein like numbers reference like elements.

FIG. 4 is a cross-sectional view taken along line B-B of FIG. 1.

FIGS. 8A and 8B are perspective views showing a second harmonic flexural vibration mode and a third harmonic flexural vibration mode of a resonator element shown in FIG. 1.

DESCRIPTION OF EXEMPLARY EMBODIMENTS

Hereinafter, preferred embodiments of a resonator, an oscillator, an electronic device, and a moving object according to the invention will be described with reference to the accompanied drawings.

1. Resonator

First, the resonator according to the invention will be described.

First Embodiment

Figure 1:
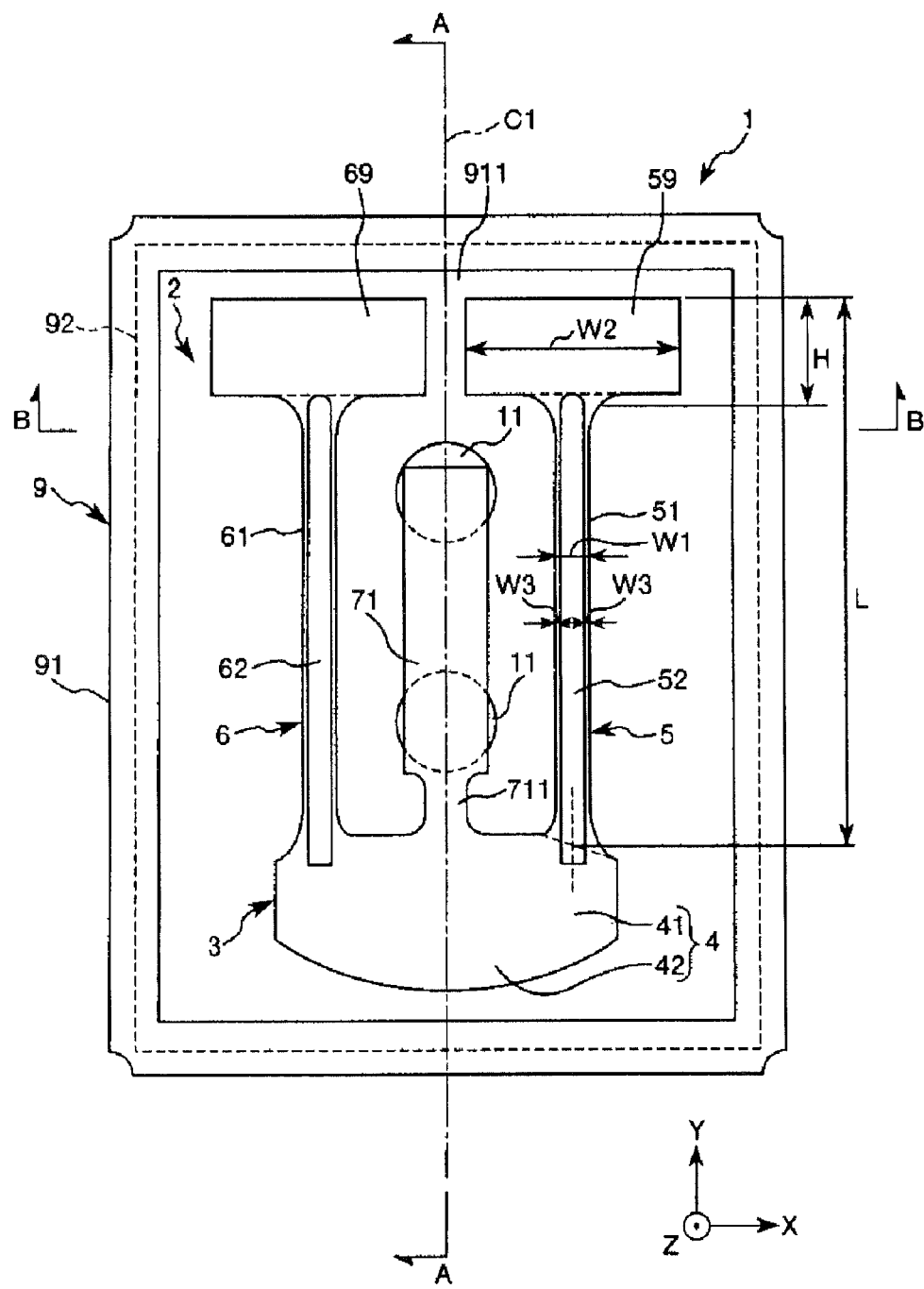
FIG. 1 is a plan view of a resonator according to a first embodiment of the invention.
Figure 2:
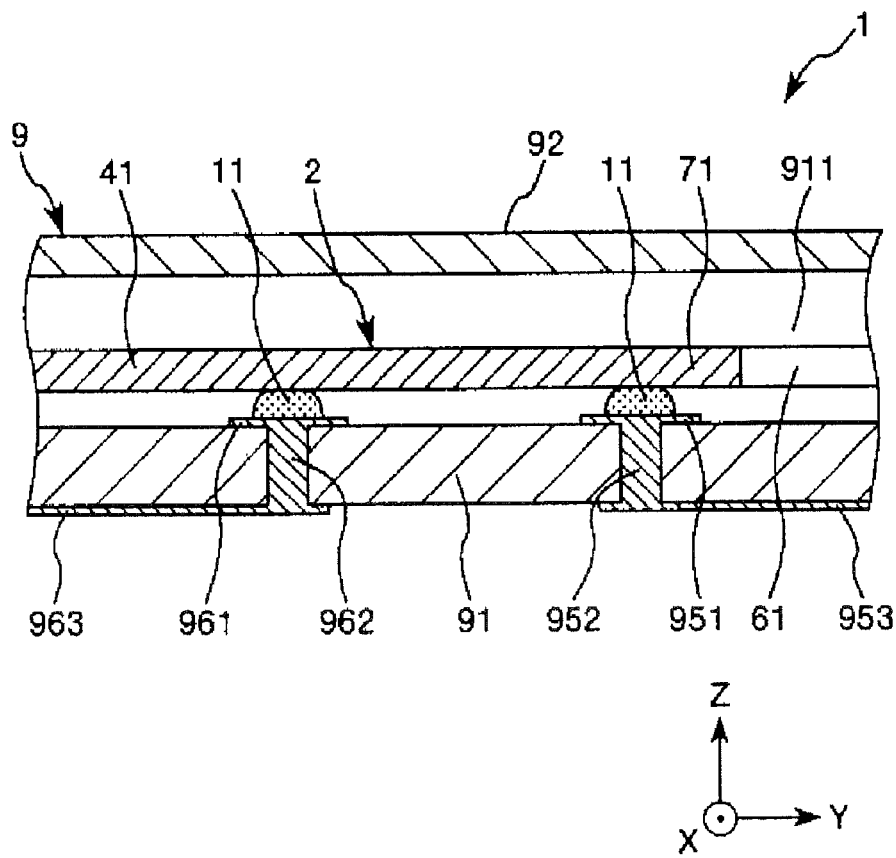
FIG. 2 is a cross-sectional view taken along line A-A of FIG. 1.
Figure 3A:
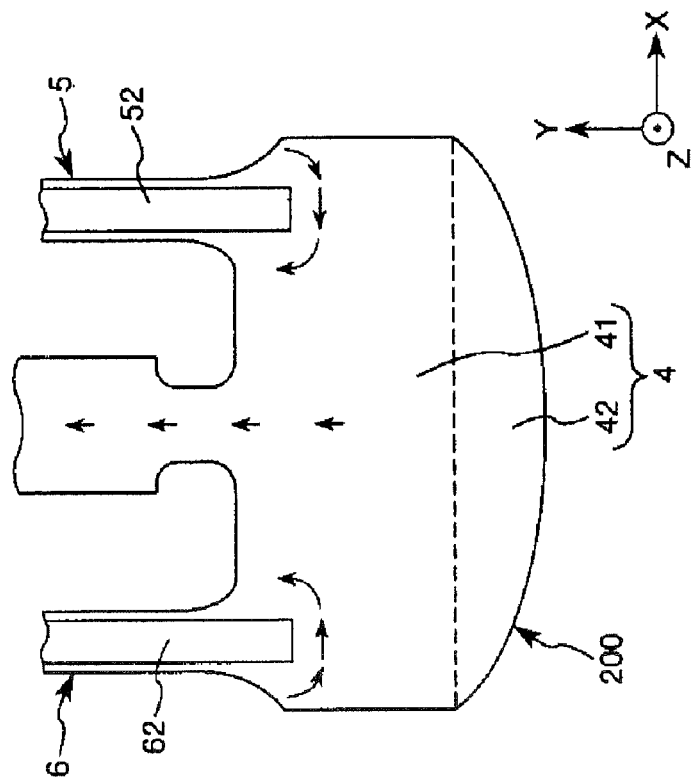
FIGS. 3A and 3B are plan views illustrating principles of vibration leakage reduction.
Figure 3B:
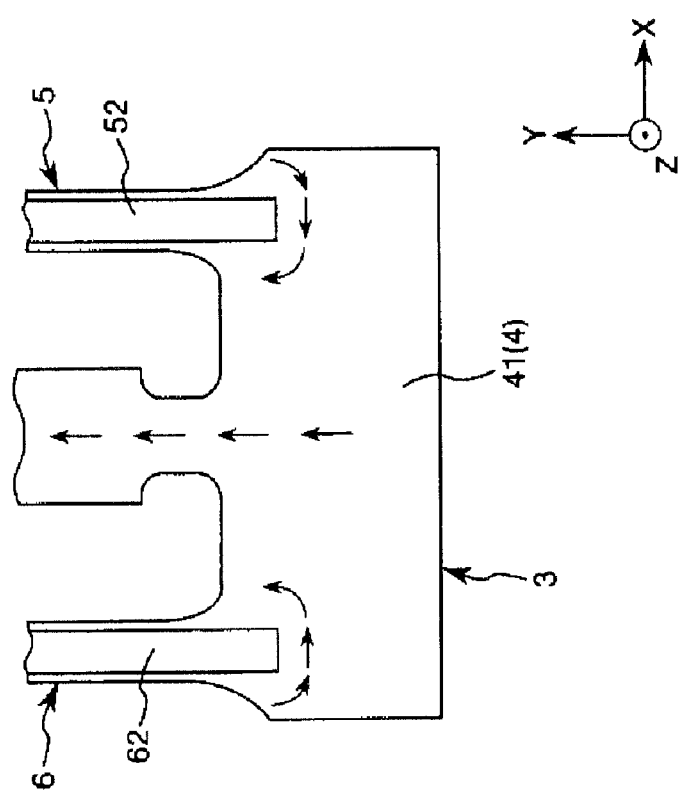
Figure 5:
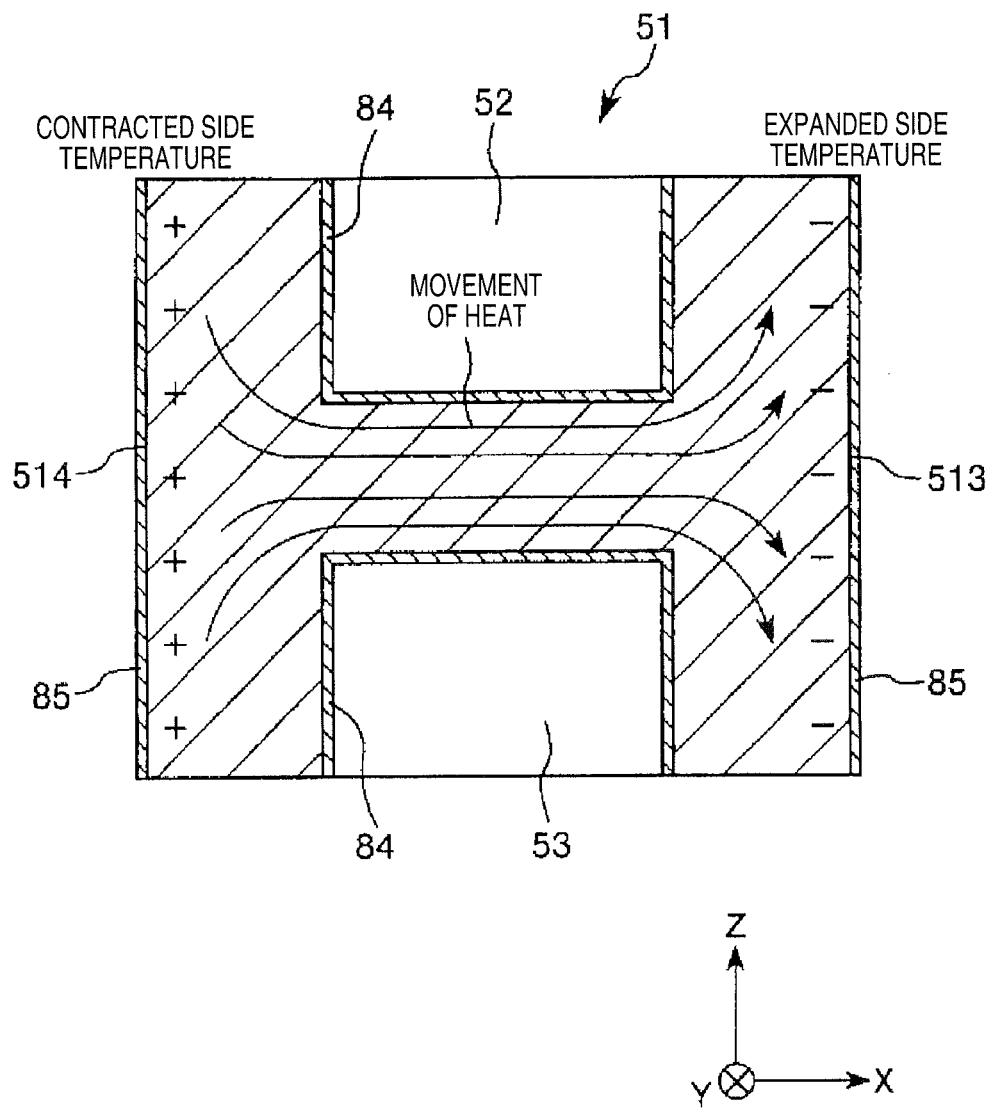
FIG. 5 is a cross-sectional view of vibrating arms illustrating thermal conduction at the time of flexural vibration.
Figure 6:
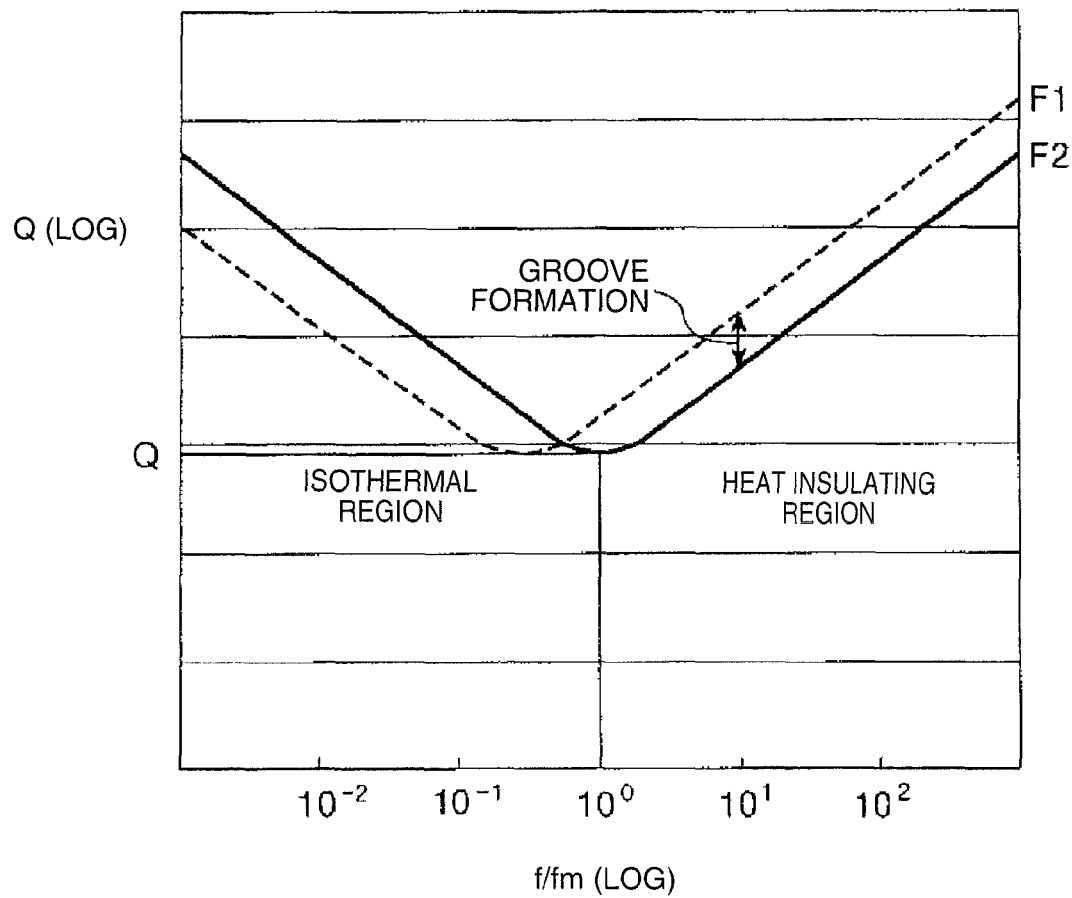
FIG. 6 is a graph showing a relationship between a Q value and $f/f_m$.
Figure 7B:
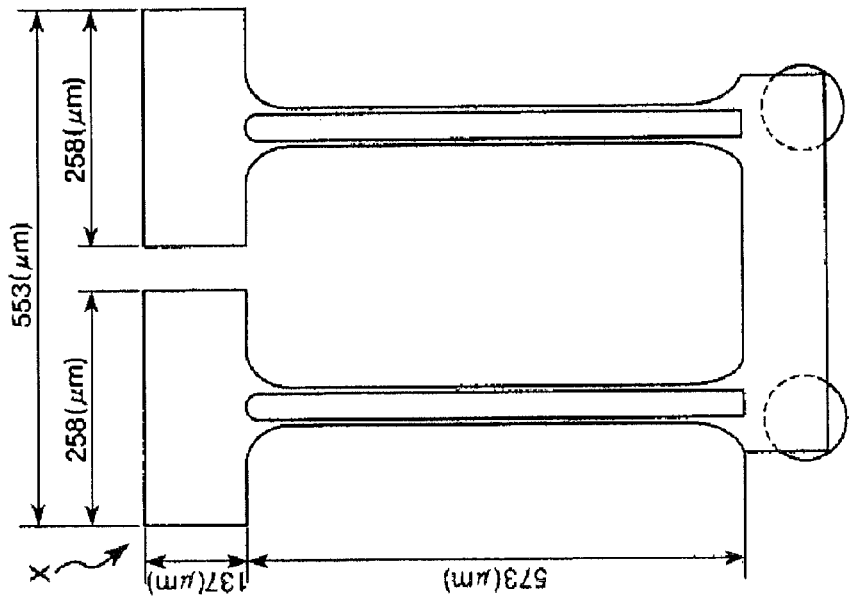
FIGS. 7A and 7B are plan views showing a resonator element shown in FIG. 1 and a resonator element used in a simulation.
Figure 7A:
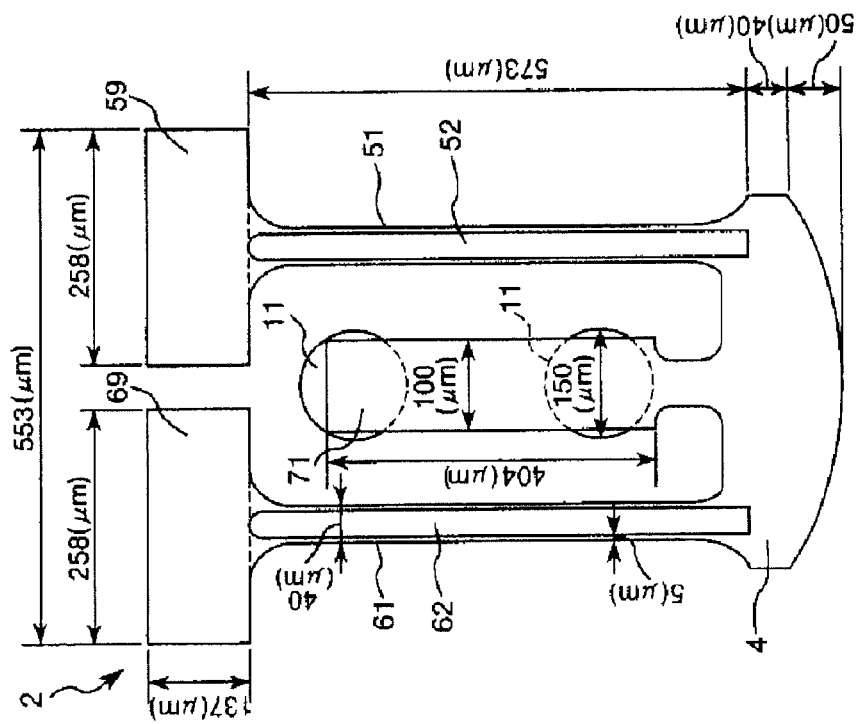

FIG. 1 is a plan view of the resonator according to a first embodiment of the invention, FIG. 2 is a cross-sectional view taken along line A-A of FIG. 1, FIGS. 3A and 3B are plan views illustrating principles of vibration leakage reduction, FIG. 4 is a cross-sectional view taken along line B-B of FIG. 1, FIG. 5 is a cross-sectional view of vibrating arms illustrating thermal conduction at the time of flexural vibration, FIG. 6 is a graph showing a relationship between a Q value and $f/f_m$, FIGS. 7A and 7B are plan views showing a resonator element shown in FIG. 1 and a resonator element used in a simulation, and FIGS. 8A and 8B are perspective views showing a second harmonic flexural vibration mode and a third harmonic flexural vibration mode of the resonator element shown in FIG. 1. Hereinafter, for convenience of description, as shown in FIG. 1, three axes orthogonal to each other are set as an X axis (an electrical axis of quartz crystal), a Y axis (a mechanical axis of quartz crystal), and a Z axis (an optical axis of quartz crystal), and n is set as a natural number equal to or larger than 2, if not otherwise specified.

A resonator 1 shown in FIG. 1 and FIG. 2 includes a resonator element 2, and a package 9 for accommodating the resonator element 2. Hereinafter, the resonator element 2 and the package 9 will be described in detail.

Package

The package 9 includes a box-shaped base 91 including a recess 911 opened to an upper surface, and a plate-shaped lid 92 which is bonded to the base 91 so as to cover the opening of the recess 911. Such a package 9 includes an accommodation space formed by covering the recess 911 with the lid 92, and the resonator element 2 is air-tightly accommodated in the accommodation space. On a support arm 71, the resonator element 2 is attached to a bottom surface of the recess 911 through conductive adhesives 11 as a fixing material obtained by mixing a conductive filler to epoxy, acrylic, polyimide, bismuth-raid, polyester, polyurethane, and silicon resins, for example. A Young's modulus of the conductive adhesives 11 is preferably from 50 MPa to 6000 MPa and more preferably from 100 MPa to 5000 MPa. As will be described later, a material configuring the resonator element 2 is a material which is sufficiently harder than the conductive adhesives 11, and accordingly by setting an upper limit of the Young's modulus as described above, vibration in an n-th harmonic mode reaching an interface between the support arm 71 and the conductive adhesives 11 is hardly reflected by the conductive adhesives 11 and the vibration is considerably leaked to the outside as vibration leakage. With respect to this, in a fundamental flexural vibration mode, the vibration reaching the interface between the support arm 71 and the conductive adhesives 11 is extremely small and accordingly the vibration leakage is also extremely small, with an effect of offset of the vibration of a base portion 4 which will be described later. As a result, since it is possible to intentionally degrade only a Q value in the n-th flexural vibration mode without degrading a Q value in the fundamental flexural vibration mode, it is possible to set a value of equivalent series resistance $R_n$ in the n-th harmonic flexural vibration mode to be sufficiently greater than a value of equivalent series resistance $R_1$ in the fundamental flexural vibration mode. In addition, if the Young's modulus is excessively small, the conductive adhesives 11 may be considerably deformed when impact is applied to the resonator 1 from the outside, hammerheads 59 and 69 formed on a distal end of the resonator element 2 in a positive Y axis direction may be broken due to collision with the base 91 or the lid 92, and a resonance frequency in the fundamental flexural vibration mode may be increased, and accordingly, by setting a lower limit of the Young's modulus as described above, it is possible to obtain the stabilized resonator 1 in which the resonance frequency in the fundamental flexural vibration mode hardly changes even when the impact is applied to the resonator 1 from the outside.

Herein, it has been described that the resonator element 2 is fixed to the bottom surface of the recess 911 through the conductive adhesives 11 as an example, on the support arm 71, but it is not limited thereto, and the same effect is obtained even when the resonator element is fixed thereto through a non-conductive adhesive instead of one of the two conductive adhesives 11 or both of them. In addition, the resonator element may be fixed thereto through a metallic material such as Au having higher dimension accuracy at the time of shape forming as a fixing unit compared to that of the conductive adhesive.

The accommodation space may be in a reduced pressure (preferably vacuum) state, or may be filled with inert gas such as nitrogen, helium, argon, or the like in a sealing manner. Accordingly, a vibration property of the resonator element 2 is improved.

A configuration material of the base 91 is not particularly limited, but various ceramics such as aluminum oxide or the like can be used. A configuration material of the lid 92 is not particularly limited, but a member having a similar linear expansion coefficient to that of the configuration material of the base 91 is preferably used. For example, in a case where the configuration material of the base 91 is set as the ceramics described above, an alloy such as Kovar is preferably used. The bonding of the base 91 and the lid 92 is not particularly limited, and the base and the lid may be bonded to each other through the adhesive or may be bonded to each other by seam welding or the like, for example.

Connection terminals 951 and 961 are formed on the bottom surface of the recess 911 of the base 91. Although not shown, a first driving electrode 84 of the resonator element 2 is extracted to the middle of the support arm 71 in a Y axis direction, and the conductive adhesive 11 is electrically connected to the connection terminal 951 at that portion. In the same manner as described above, although not shown, a second driving electrode 85 of the resonator element 2 is extracted to the middle of the support arm 71 in the Y axis direction, and is electrically connected to the connection terminal 961 at that portion through the conductive adhesive 11.

The connection terminal 951 is electrically connected to an external terminal 953 formed on the bottom surface of the base 91 through a penetration electrode 952 which penetrates the base 91, and the connection terminal 961 is electrically connected to an external terminal 963 formed on the bottom surface of the base 91 through a penetration electrode 962 which penetrates the base 91.

The configurations of the connection terminals 951 and 961, the penetration electrodes 952 and 962, and the external terminals 953 and 963 are not particularly limited, as long as they have conductivity, and they may be configured with a metal coating film obtained by laminating each coating film such as Ni (nickel), Au (gold), Ag (silver), or Cu (copper) to a metalized layer (base layer) such as Cr (chrome) or W (tungsten).

Resonator Element 2

As shown in FIG. 1, FIG. 2, and FIG. 4, the resonator element 2 includes a quartz crystal substrate 3, and the first and second driving electrodes 84 and 85 formed on the quartz crystal substrate 3. In FIG. 1 and FIG. 2, for convenience of description, the first and second driving electrodes 84 and 85 are not shown.

The quartz crystal substrate 3 is configured with a Z-cut quartz crystal plate. Accordingly, the resonator element 2 can exhibit an excellent vibration property. The Z-cut quartz crystal plate is a quartz crystal substrate having the Z axis as a thickness direction. The Z axis preferably coincides with the thickness direction of the quartz crystal substrate 3, but may be slightly inclined with respect to the thickness direction from a viewpoint of reduction in change of a frequency temperature close to room temperature.

That is, in a case where an inclination angle is set as 0 degrees ($-5$ degrees$\leq\theta\leq15$ degrees), the quartz crystal substrate 3 is configured so that, when an axis obtained by inclining the Z axis by $\theta$ degrees so as to rotate the positive Z side in the negative Y direction of the Y axis is set as a Z' axis, and an axis obtained by inclining the Y axis by θ degrees so as to rotate the positive Y side in the positive Z direction of the Z axis is set as a Y' axis, by using the X axis of an orthogonal coordinate system configured with the X axis as the electrical axis of the quartz crystal, the Y axis as the mechanical axis, and the Z axis as the optical axis, as a rotation axis, a direction along the Z' axis is set as a thickness direction, and a surface including the X axis and the Y' axis is set as a main surface.

As shown in FIG. 1, the quartz crystal substrate 3 includes the base portion 4, a pair of vibrating arms 5 and 6 which extend from the base portion 4 on a distal end (first end portion) side of the base portion 4, and the support arm (support portion) 71 which extends from the base portion 4 to the same direction as the vibrating arms 5 and 6 between the vibrating arms. Accordingly, the base portion 4, the vibrating arms 5 and 6, and the support arm 71 are integrally formed.

The base portion 4 has an expanse in an XY plane and has a plate shape having a thickness in the Z axis direction. The base portion 4 includes a portion (main body portion 41) for supporting and connecting the vibrating arms 5 and 6, and a reduced width portion 42 for reducing the vibration leakage.

The reduced width portion 42 is provided on the proximal end (second end portion) side of the main body portion 41, that is, on a side opposite a side in which the vibrating arms 5 and 6 extend. The width (length in the X axis direction) of the reduced width portion 42 gradually decreases as being separated from the vibrating arms 5 and 6, that is, from the center (XY plane center of the main body portion 41) of the base portion 4, along a center line C1 between the vibrating arms 5 and 6, and an outline (edge portion) thereof has an arch shape (circular arc shape). By including the reduced width portion 42, it is possible to effectively suppress the vibration leakage of the resonator element 2.

The configuration will be described in detail as follows. For convenience of description, the shape of the resonator element 2 is symmetrical with respect to a predetermined axis (center line C1) which is parallel with the Y axis.

First, as shown in FIG. 3A, a case in which the reduced width portion 42 is not provided will be described. In a case where the vibrating arms 5 and 6 are subjected to bending deformation substantially in the XY plane so as to be separated from each other, in a portion of the main body portion 41 to which the vibrating arm 5 is connected, displacement which is nearly clockwise rotation movement occurs as shown by an arrow, and in a portion of the main body portion 41 to which the vibrating arm 6 is connected, displacement which is nearly counter clockwise rotation movement occurs as shown by an arrow (herein, it is not strictly movement which can be stated as the rotation movement, and therefore it is conveniently described as "nearly rotation movement").

Since components of the displacement in the X axis direction face directions opposite each other, offset is performed in the center of the main body portion 41 in the X axis direction, and the displacement in the positive Y axis direction remains (herein, strictly the displacement in the Z axis direction also remains, but it is omitted herein). That is, the main body portion 41 is subjected to the bending deformation so that the center portion in the X axis direction displaces in the positive Y axis direction. When the adhesive is formed on the center portion in the Y axis direction of the main body portion 41 having the displacement in the positive Y axis direction, and the main body portion is fixed to the package through the adhesive, elastic energy accompanied with the displacement in the positive Y axis direction leaks to the outside through the adhesive. This loss is called vibration leakage and causes degradation of a Q value, and this results in degradation of a CI value.

With respect to this, as shown in FIG. 3B, in a case where the reduced width portion 42 is provided, the reduced width portion 42 has the arch-shaped (curved) outline, and accordingly, the displacements close to the rotation movement described above are supported by each other in the reduced width portion 42. That is, in the center portion of the reduced width portion 42 in the X axis direction, the displacement in the X axis direction is offset as in the same manner as the center portion of the main body portion 41 in the X axis direction, and the displacement in the Y axis direction is suppressed. In addition, since the outline of the reduced width portion 42 is an arch shape, the displacement in the positive Y axis direction which tends to occur in the main body portion 41, is also suppressed. As a result, the displacement of the center portion of the base portion 4 in the X axis direction, in the positive Y axis direction in a case where the reduced width portion 42 is provided, is much more decreased compared to a case where the reduced width portion 42 is not provided. That is, it is possible to obtain the resonator element having reduced vibration leakage.

Herein, the outline of the reduced width portion 42 has an arch shape, but the outline thereof is not limited thereto as long as the operation described above is realized. For example, a reduced width portion formed to have a level difference (step shape) with a plurality of linear lines may be used as the outline thereof, and a reduced width portion formed to have a mountain shape (triangular shape) or a circular arc shape with two or more linear lines may be used as the outline thereof.

The vibrating arms 5 and 6 are arranged in the X axis direction (second direction), and extend in the Y axis direction (first direction) from the distal end of the base portion 4 so as to be parallel with each other. Each of the vibrating arms 5 and 6 has a longitudinal shape, and a proximal end thereof is a fixed end and a distal end thereof is a free end. The vibrating arms 5 and 6 respectively include arm portions 51 and 61, and hammerheads (wide width portions which have a greater length along the X axis direction than the arm portions 51 and 61) 59 and 69 which are provided on the distal end of the arm portions 51 and 61 (side opposite the base portion 4), as weight portions having an approximately rectangular shape in an XY plan view.

The hammerheads 59 and 69 as the weight portions are the wide width portions having a greater length along the X axis direction than the arm portions 51 and 61, but it is not limited thereto as long as the mass density per unit length is set to be greater than that of the arm portions 51 and 61. For example, the weight portions may have configurations in which a length thereof is set to be the same as the length of the arm portions 51 and 61 in the X axis direction and a thickness thereof in the Z axis direction is set to be greater than that of the arm portions. In addition, the weight portions may be configured by providing metal such as Au or the like to be thick on surfaces of the arm portions 51 and 61 which are the weight portions. Further, the weight portions may be configured with a material having higher mass density than that of the arm portions 51 and 61.

As shown in FIG. 4, the arm portion 51 includes a pair of main surfaces 511 and 512 which are configured by the XY plane, and a pair of side surfaces 513 and 514 which are configured by the YZ plane and connect the pair of main surfaces 511 and 512 to each other. The arm portion 51 includes a bottomed groove 52 opened to the main surface 511 and a bottomed groove 53 opened to the main surface 512. Each of the grooves 52 and 53 extends in the Y axis direction, the distal end thereof is positioned on a boundary portion between the arm portion 51 and the hammerhead 59, and the proximal end thereof is positioned on the base portion 4. In a portion in which the grooves 52 and 53 are formed, the arm portion 51 has an approximately H type transverse cross-sectioned shape.

As described above, by forming the grooves 52 and 53 on the vibrating arm 5, it is possible to realize the reduction in the thermoelastic loss and to exhibit the excellent vibration property (which will be described later). The length of the grooves 52 and 53 is not limited, and each distal end of the grooves 52 and 53 may be positioned on the boundary portion between the arm portion 51 and the hammerhead 59 as described in the embodiment, but if each distal end of the grooves 52 and 53 is configured to extend to the hammerhead 59, stress concentration occurring in the vicinity of each distal end of the grooves 52 and 53 is relaxed, and therefore a concern about folding or cracks occurring when the impact is applied thereto is reduced. Alternatively, if each distal end of the grooves 52 and 53 is configured to be positioned on the base portion side with respect to the position of the embodiment, stress concentration occurring in the vicinity of the boundary between the arm portion 51 and the hammerhead 59 is relaxed, and therefore a concern about folding or cracks occurring when the impact is applied thereto is reduced. In addition, since each proximal end of the grooves 52 and 53 extends to the base portion 4, the stress concentration occurring in the vicinity of the boundary therebetween is relaxed. Therefore, a concern about folding or cracks occurring when the impact is applied thereto is reduced. Alternatively, if each proximal end of the grooves 52 and 53 is configured to be positioned in the Y axis direction (direction in which the vibrating arm 5 extends) with respect to the boundary between the base portion 4 and the arm portion 51, stress concentration occurring in the vicinity of the boundary between the base portion 4 and the arm portion 51 is relaxed, and therefore a concern about folding or cracks occurring when the impact is applied thereto is reduced.

In addition, it is preferable that the grooves 52 and 53 are formed by adjusting the position of the grooves 52 and 53 in the X axis direction with respect to the position of the vibrating arm 5, so that across section gravity center of the vibrating arm 5 coincides with a center of a cross-sectioned shape of the vibrating arm 5. With this configuration, unnecessary vibration of the vibrating arm 5 (in detail, inclination vibration including component in an out-of-plane direction) is reduced, and accordingly it is possible to reduce the vibration leakage. In this case, the driving of unnecessary vibration is also reduced, and accordingly it is possible to relatively increase a driving region to set the CI value small.

In addition, it is preferable to slightly shift the center of the hammerhead 59 in the X axis direction from the center of the vibrating arm 5 in the X axis direction. With this configuration, it is possible to reduce the vibration of the base portion 4 in the Z axis direction which occurs due to a twist of the vibrating arm 5 at the time of the flexural vibration, and accordingly it is possible to suppress the vibration leakage.

Hereinabove, the vibrating arm 5 has been described. The vibrating arm 6 has the same configuration as that of the vibrating arm 5. That is, the arm portion 61 includes a pair of main surfaces 611 and 612 which are configured by the XY plane, and a pair of side surfaces 613 and 614 which are configured by the YZ plane and connect the pair of main surfaces 611 and 612 to each other. The arm portion 61 includes a bottomed groove 62 opened to the main surface 611 and a bottomed groove 63 opened to the main surface 612. Each of the grooves 62 and 63 extends in the Y axis direction, the distal end thereof is positioned on a boundary portion between the arm portion 61 and the hammerhead 69, and the proximal end thereof is positioned on the base portion 4. In a portion in which the grooves 62 and 63 are formed, the arm portion 61 has an approximately H type transverse cross-sectioned shape.

In addition, it is preferable to slightly shift a center of the hammerhead 69 in the X axis direction from a center of the vibrating arm 6 in the X axis direction. With this configuration, it is possible to reduce the vibration of the base portion 4 in the Z axis direction which occurs due to a twist of the vibrating arm 6 at the time of the flexural vibration, and accordingly it is possible to suppress the vibration leakage.

As shown in FIG. 4, in the vibrating arm 5, a pair of first driving electrodes 84 and a pair of second driving electrodes 85 are formed. In detail, one of the pair of first driving electrodes 84 is formed on an inner surface (side surface) of the groove 52, and the other one is formed on an inner surface (side surface) of the groove 53. In addition, one of the pair of second driving electrodes 85 is formed on the side surface 513, and the other one is formed on the side surface 514. In the same manner as described above, in the vibrating arm 6 as well, the pair of first driving electrodes 84 and the pair of second driving electrodes 85 are formed. In detail, one of the pair of first driving electrodes 84 is formed on the side surface 613, and the other one is formed on the side surface 614. In addition, one of the pair of second driving electrodes 85 is formed on an inner surface (side surface) of the groove 62, and the other one is formed on an inner surface (side surface) of the groove 63.

If alternating voltage is applied between the first and second driving electrodes 84 and 85, the vibrating arms 5 and 6 vibrate at a predetermined frequency in the in-plane direction (XY plan direction) so as to alternately repeat between approach and separation from each other along the X axis direction (second direction).

The configuration of the first and second driving electrodes 84 and 85 is not particularly limited, and the first and second driving electrodes can be formed with metallic materials such as gold (Au), gold alloy, platinum (Pt), aluminum (Al), aluminum alloy, silver (Ag), silver alloy, chrome (Cr), chrome alloy, nickel (Ni), nickel alloy, copper (Cu), molybdenum (Mo), niobium (Nb), tungsten (W), iron (Fe), titanium (Ti), cobalt (Co), zinc (Zn), zirconium (Zr), and the like, and conductive material such as indium tin oxide (ITO).

As the specific configuration of the first and second driving electrodes 84 and 85, the driving electrodes can be configured by forming an Au layer having a length of 700 Å or less on a Cr layer having a length of 700 Å or less, for example. Particularly, since the thermoelastic loss of Cr or Au is great, the length of the Cr layer and the Au layer is preferably set to be 200 Å or less. In a case of increasing insulation breakdown resistance, the length of the Cr layer and the Au layer is preferably set to be 1000 Å or more. In addition, since Ni has a thermal expansion coefficient close to that of the quartz crystal, by setting a Ni layer as a base instead of the Cr layer, it is possible to reduce thermal stress originated from the electrodes and to obtain the resonator element 2 having excellent long-term reliability (aging property).

As described above, in the resonator element 2, by forming the grooves 52, 53, 62, and 63 on the vibrating arms 5 and 6, the thermoelastic loss is reduced. Hereinafter, the configuration thereof will be described in detail using the vibrating arm 5 as an example.

As described above, the vibrating arm 5 is subjected to the flexural vibration in the in-plane direction by applying the alternating voltage between the first and second driving electrodes 84 and 85. As shown in FIG. 5, at the time of the flexural vibration, if the side surface 513 of the arm portion 51 contracts, the side surface 514 expands, and conversely if the side surface 513 expands, the side surface 514 contracts. In a case where a Gough-Joule effect does not occur in the vibrating arm 5 (energy elasticity is dominant over entropy elasticity), a temperature of the contracting side surface increases and a temperature of the expanding side surface decreases among the side surfaces 513 and 514, and accordingly, a difference in temperatures occurs between the side surface 513 and the side surface 514, that is, inside the arm portion 51. A loss in vibration energy occurs by the thermal conduction occurring from such a difference in temperatures, and accordingly the Q value of the resonator element 2 decreases. A loss in energy accompanied with the decrease of the Q value is called the thermoelastic loss.

In the resonator element which vibrates in the flexural vibration mode which is the configuration of the resonator element 2, when a flexural vibration frequency (mechanical flexural vibration frequency) f of the vibrating arm 5 changes, the Q value becomes a minimum value when the flexural vibration frequency of the vibrating arm 5 coincides with a thermal relaxation frequency $f_m$. The thermal relaxation frequency $f_m$ can be acquired by an equation of $f_m=1/(2\pi\tau)$ (herein, in the equation, when π is a circular constant and e is set as a mathematical constant, τ is relaxation time necessary for setting the difference in temperatures to be $e^{-1}$ times by the thermal conduction).

If the thermal relaxation frequency when the vibrating arm 5 is assumed to have a flat plate structure (structure with a rectangular cross-sectioned shape) is set as $f_{m0}$, $f_{m0}$ can be acquired by the following formula.

$$f_{m0}=\pi k/(2\rho C p a^2) \qquad (4)$$

π is a circular constant, k is thermal conductivity of the vibrating arm 5 in a vibration direction, ρ is mass density of the vibrating arm 5, Cp is thermal capacity of the vibrating arm 5, and a is a width (effective width) of the vibrating arm 5 in the vibration direction. In a case where constant numbers of the material (that is, quartz crystal) of the vibrating arm 5 are input to the thermal conductivity k, the mass density ρ, and the thermal capacity Cp of formula (1), the thermal relaxation frequency $f_{m0}$ to be acquired is a value in a case where the grooves 52 and 53 are not provided on the vibrating arm 5.

In the vibrating arm 5, the grooves 52 and 53 are formed so as to be positioned between the side surfaces 513 and 514. Accordingly, a thermal movement path for performing temperature balancing by the thermal conduction with respect to the difference in temperatures between the side surfaces 513 and 514 which occurs at the time of the flexural vibration of the vibrating arm 5, is formed so as to make a detour around the grooves 52 and 53, and the thermal movement path is set to be longer than a linear distance (shortest distance) between the side surfaces 513 and 514. Thus, the relaxation time τ becomes longer compared to the case in which the grooves 52 and 53 are not provided on the vibrating arm 5, and the thermal relaxation frequency $f_m$ becomes low.

FIG. 6 is a graph showing $f/f_m$ relativity of the Q value of the resonator element in the flexural vibration mode. In the graph, a curved line F1 shown by a dotted line indicates a case in which the grooves are formed on the vibrating arm as the resonator element 2 (a case in which the transverse cross-sectioned shape of the vibrating arm is H shape), and a curved line F2 shown by a solid line indicates a case in which the grooves are not formed on the vibrating arm (a case in which the transverse cross-sectioned shape of the connection arm is a rectangle). As shown in the graph, the shapes of the curved lines F1 and F2 are not different from each other, but the curved line F1 is shifted in a frequency decreasing direction with respect to the curved line F2, with the decrease of the thermal relaxation frequency $f_m$ as described above. Accordingly, if the thermal relaxation frequency in a case where the grooves are formed on the vibrating arm as in the resonator element 2 is set as $f_{m1}$, by satisfying the following formula (5), the Q value of the resonator element in which the grooves are formed on the vibrating arm is constantly higher than the Q value of the resonator element in which the grooves are not formed on the vibrating arm.

$$f > \sqrt{f_{m0} f_{m1}} \qquad (5)$$

In addition, if the relationship is limited to $f/f_{m0}>1$, it is possible to obtain a higher Q value.

In FIG. 6, a region of $f/f_m<1$ is also called an isothermal region, and in this isothermal region, the Q value increases as $f/f_m$ decreases. This is because the difference in temperature in the vibrating arm described above hardly occurs as the mechanical frequency of the vibrating arm decreases (vibration of the vibrating arm becomes slow). Accordingly, in an extreme limit when $f/f_m$ is set to be close to 0 (zero), an isothermal quasi-static manipulation is performed, and the thermoelastic loss illimitably approaches 0 (zero). On the other hand, a region of $f/f_m>1$ is also called a heat insulating region, and in this heat insulating region, the Q value increases as $f/f_m$ increases. This is because switching of the temperature increase and the temperature effect of each side surface becomes rapid as the mechanical frequency of the vibrating arm increases, and the time in which the thermal conduction as described above is removed. Accordingly, in an extreme limit when $f/f_m$ is illimitably set to be great, a heat insulating manipulation is performed, and the thermoelastic loss illimitably approaches 0 (zero). Thus, satisfying the relationship of $f/f_m>1$ can be said that $f/f_m$ is in the heat insulating region.

Since the configuration material (metal material) of the first and second driving electrodes 84 and 85 has high thermal conductivity compared to the quartz crystal which is the configuration material of the vibrating arms 5 and 6, in the vibrating arm 5, heat conduction through the first driving electrodes 84 is actively performed, and in the vibrating arm 6, heat conduction through the second driving electrodes 85 is actively performed. If the heat conduction through the first and second driving electrodes 84 and 85 is actively performed, the relaxation time t is reduced. Herein, it is preferable to prevent or suppress occurrence of the heat conduction described above, by dividing the first driving electrodes 84 into the side surface 513 side and the side surface 514 side on bottom surfaces of the grooves 52 and 53 in the vibrating arm 5, and dividing the second driving electrodes 85 into the side surface 613 side and the side surface 614 side on bottom surfaces of the grooves 62 and 63 in the vibrating arm 6. As a result, the reduction of the relaxation time τ is prevented and the resonator element 2 having a higher Q value is obtained.

Next, a relationship between the entire length of the vibrating arms 5 and 6, and the length and width of the hammerheads 59 and 69 will be described. Since the vibrating arms 5 and 6 have the same configuration as each other, hereinafter, the vibrating arm 5 will be described as a representative, and the description of the vibrating arm 6 will be omitted.

As shown in FIG. 1, when the entire length of the vibrating arm 5 (length in the Y axis direction) is set as L [μm] and the length of the hammerhead 59 (length in the Y axis direction) is set as H [μm], it is preferable that the vibrating arm 5 satisfies a relationship of 0.012<H/L<0.3, and it is more preferable that the vibrating arm satisfies a relationship of 0.046<H/L<0.223. By satisfying the relationship described above, the equivalent series resistance $R_1$ of the resonator element 2 in the fundamental flexural vibration mode is suppressed to be low, and accordingly the resonator element 2 with small vibration loss and an excellent vibration property is obtained.

Herein, in the embodiment, the proximal end of the vibrating arm 5 is set in a portion which is positioned in the center of the width of the vibrating arm 5 (length in the X axis direction) of a line segment connecting a portion in which the side surface 514 is connected to the base portion 4 and a portion in which the side surface 513 is connected to the base portion 4. A free end portion of the arm portion 51 has a tapered shape in which the width gradually increases towards the free end side, but in a case where the arm portion 51 includes a portion in which the width of the tapered portion (length in the X axis direction) is 1.5 times or more of the width of the arm portion 51 (length in the X axis direction), this portion is also contained in the length H of the hammerhead 59.

When the width of the arm portion 51 (length in the X axis direction) is set as W1 [μm] and the width of the hammerhead 59 (length in the X axis direction) is set as W2 [μm], it is preferable that the vibrating arm 5 satisfies a relationship of $1.5 \leq W2/W1 \leq 10.0$ and it is more preferable that the vibrating arm satisfies a relationship of $1.6 \leq W2/W1 \leq 7.0$. By satisfying the relationship described above, it is possible to secure the wide width of the hammerhead 59. Accordingly, although the length H of the hammerhead 59 is relatively small as described above (less than 30% of L), it is possible to sufficiently exhibit a mass effect by the hammerhead 59. Therefore, by satisfying the relationship of $1.5 \leq W2/W1 \leq 10.0$, it is possible to suppress the entire length L of the vibrating arm 5 and to realize the miniaturization of the resonator element 2.

As described above, in the vibrating arm 5, by satisfying the relationship of $0.012 < H/L < 0.3$ and the relationship of $1.5 \leq W2/W1 \leq 10.0$, the miniaturized resonator element 2 with a sufficiently suppressed CI value is obtained by a synergetic effect of the two relationships.

By setting the L to be equal to or smaller than 2 mm, preferably equal to or smaller than 1 mm, it is possible to obtain the miniaturized resonator element 2 which is used in an oscillator to be loaded on a portable musical instrument or an IC card. In addition, by setting the W1 to be equal to or smaller than 100 μm, preferably equal to or smaller than it is possible to obtain the resonator element 2 which is used in an oscillation circuit for realizing low power consumption and to resonate at a low frequency, even in the range of the L.

In the heat insulating region, in a case where the vibrating arm extends in the Y axis direction by the Z-cut quartz crystal plate and is subjected to the flexural vibration in the X axis direction, W1 is preferably equal to or greater than 12.8 μm, in a case where the vibrating arm extends in the X axis direction by the Z-cut quartz crystal plate and is subjected to the flexural vibration in the Y axis direction, W1 is preferably equal to or greater than 14.4 μm, and in a case where the vibrating arm extends in the Y axis direction by the X-cut quartz crystal plate and is subjected to the flexural vibration in the Z axis direction, W1 is preferably equal to or greater than 15.9 μm. With this configuration, since it is possible to reliably have the heat insulating region, the thermoelastic loss decreases by the formation of the grooves 52 and 53 to improve the Q value, and the driving is performed in the region in which the grooves 52 and 53 are formed, and thus the CI value (in which a electric-field effect is high and a driving area is obtained) becomes low.

The support arm 71 which extends from the base portion 4 (main body portion 41) along the center line C1 (Y axis direction) is provided between the pair of vibrating arms 5 and 6 (arm portions 51 and 61) described above. The support arm 71 has an approximately rectangular shape in the XY plan view, and the resonator element 2 is fixed to the package 9 through the conductive adhesives 11 and 11 on the support arm 71, as shown in FIG. 1 and FIG. 2. With the configuration described above, it is possible to more effectively reduce the vibration leakage of the resonator element 2.

In addition, the support arm 71 includes a narrowed portion 711 having a decreased length (width) along the X axis direction, in the vicinity of a boundary portion with the base portion 4 thereof. Accordingly, it is possible to separate a resonance frequency in an X common mode in which the vibrating arms 5 and 6 are subjected to the flexural vibration in the same direction in the approximately XY plane, from a resonance frequency in the fundamental flexural vibration mode in which the vibrating arms 5 and 6 are subjected to the flexural vibration so as to approach and separate from each other in the approximately XY plane. As a result, a concern about joining of the fundamental flexural vibration mode and the X common mode is decreased, and when performing the flexural vibration of the resonator element 2 in the fundamental flexural vibration mode, the vibration in which a vibration mode included in the X common mode is overlapped hardly occurs, and it is possible to reduce the vibration leakage. The narrowed portion 711 is not limited to the shape as shown in FIG. 1, and a region with the narrow width (length in the X axis direction) with respect to the support arm 71 may include a portion extended in the Y axis direction. Particularly, when a minimum width of the narrowed portion 711 is from 20% to 50% with respect to an average width of the region except for the narrowed portion of the support arm 71, and the length of the narrowed portion 711 (length in the Y axis direction) is set as $L_0$, the length of the support arm 71 is set as $L_1$, and the length of the arm portion 51 is set as $L_2$, it is desirable to satisfy a relationship of $0.1 < L_0/L_2 \leq 0.9$ and $L_1 < L_2$. With this configuration, since it is possible to sufficiently separate the resonance frequency in the X common mode from the resonance frequency in the fundamental flexural vibration mode, as a result it is possible to sufficiently reduce the vibration leakage in the fundamental flexural vibration mode.

The resonator element 2 can be obtained by processing the quartz crystal substrate, for example, with any of a wet etching method such as alkali wet etching and a dry etching method such as laser beam etching or reactive gas etching, or with a combination of the plurality of methods, but it is particularly preferable to obtain the resonator element by the processing performed with the wet etching method. According to the wet etching method, it is possible to process the quartz crystal substrate with excellent precision with a simple device.

In addition, the quartz crystal substrate 3 has been described as the Z-cut quartz crystal substrate, but it is not limited thereto in the invention. As the substrate used for forming the resonator element 2, for example, it is possible to use a substrate configured using Lithium niobate ($LiNbO_3$), lithium tantalate ($LiTaO_3$), Lithium tetraborate ($Li_2b_4O_7$), potassium niobate ($KNbO_3$), gallium phosphate ($GaPO_4$), langasite crystal ($La_3Ga_5SiO_{14}$), gallium arsenide (GaAs), aluminum nitride (AlN), zinc oxide (ZnO, $Zn_2O_3$), barium titanate ($BaTiO_3$), lead titanate ($PbPO_3$), lead zirconate titanate (PZT), or silicon (Si) as a main material.

In addition, it is possible to form the resonator element using a material other than the piezoelectric material. For example, it is possible to form the resonator element using a silicon semiconductor material. The vibration (driving) method of the resonator element is not limited to piezoelectric driving. Other than the piezoelectric driving type using a piezoelectric substrate, it is possible to exhibit the configuration and the effect of the invention even with the resonator element which is an electrostatic driving type using an electrostatic force or a Lorentz driving type using a magnetic force. In the specification or the drawings, the word which is disclosed with different words having wider definition or the same definition at least once, can be replaced with the different words in any parts of the specification or the drawings.

The resonator element 2 described above is configured so as to satisfy the conditions shown by the following formula (1).

$$Q_{Ln} < Q_1 \frac{f_n}{f_1}\left(\frac{L_1}{L_n} - 1\right)^{-1} \quad (1)$$

In the formula (1), $Q_{Ln}$ represents a Q value acquired by considering only the vibration leakage in an n-th harmonic flexural vibration mode, $Q_1$ represents a Q value in the fundamental flexural vibration mode, $L_n$ represents equivalent inductance in the n-th harmonic flexural vibration mode, $L_1$ represents equivalent inductance in the fundamental flexural vibration mode, $f_n$ represents a resonance frequency in the n-th harmonic flexural vibration mode, and $f_1$ represents a resonance frequency in the fundamental flexural vibration mode.

By designing the resonator element 2 to satisfy the formula (1), it is possible to suppress the increase of the equivalent series resistance $R_1$ in the fundamental flexural vibration mode, and to set a value of equivalent series resistance $R_n$ in the n-th harmonic flexural vibration mode to be greater than the value of the equivalent series resistance $R_1$ in the fundamental flexural vibration mode. Accordingly, it is possible to suppress vibration of the resonator element 2 in the n-th harmonic flexural vibration mode, and thus, it is possible to obtain the resonator 1 which exhibits an excellent vibration property, and a concern of a false operation in which an oscillator with this resonator loaded thereon oscillates at a resonance frequency in the n-th harmonic flexural vibration mode, is reduced.

Herein, the resonator element 2 satisfying the conditions shown by the formula (1) can be obtained by setting at least one of a storage elastic modulus of a configuration material of a fixing portion (conductive adhesive 11), a loss elastic modulus of the configuration material of the fixing portion (conductive adhesive 11), the number of disposed fixing portions, a position of the fixing portion with respect to the resonator element 2, and a size of the fixing portion with respect to the resonator element 2.

Hereinafter, a calculation method of the formula (1) will be described.

In the control of the CI value by the vibration leakage, the equivalent series resistance $R_n$ in the n-th harmonic flexural vibration mode can be represented by the following formula (6).

$$R_R = \frac{1}{\omega_n C_n Q_n} \quad (6)$$

In the formula (6), $\omega_n$ represents an angular frequency in the n-th harmonic flexural vibration mode, $C_n$ represents equivalent capacitance in the n-th harmonic flexural vibration mode, $Q_n$ represents the Q value in the n-th harmonic flexural vibration mode.

In addition, the Q value ($Q_n$) in the n-th harmonic flexural vibration mode can be presented by the following formula (7) using the $Q_{Ln}$ and a Q value ($Q_{Tn}$) acquired by considering only the thermoelastic loss in the n-th harmonic flexural vibration mode (herein, viscosity resistance of air or the other loss is set to be sufficiently small).

$$Q_a^{-1} = Q_{Ta}^{-1} + Q_{La}^{-1} \quad (7)$$

If 1 is used instead of n in the formula (6) and the formula (7), a relational expression in the fundamental flexural vibration mode is obtained.

Herein, in the invention, it is necessary to set the equivalent series resistance $R_n$ in the n-th harmonic flexural vibration mode with respect to the equivalent series resistance $R_1$ in the fundamental flexural vibration mode to be greater than 1. That is, by designing, so as to satisfy the following formula (8), it is necessary to reduce a concern of a false operation in which the oscillator with the resonator according to the invention loaded thereon oscillates at a resonance frequency in the n-th harmonic flexural vibration mode.

$$\frac{R_n}{R_1} > 1 \quad (8)$$

Since $\omega_n = 2\pi f_n$ ($f_n$ is a resonance frequency [Hz] in the n-th harmonic flexural vibration mode), the following formula (9) can be acquired by the formulae (6) to (8).

$$\frac{R_n}{R_1} = \frac{\omega_1 C_1 Q_1}{\omega_n C_n Q_n} = \frac{f_1 C_1}{f_n C_n} \cdot \frac{Q_{Tn}^{-1} + Q_{Ln}^{-1}}{Q_{T1}^{-1} + Q_{L1}^{-1}} > 1 \quad (9)$$

However, the $Q_{Tn}$ is known to be represented by the following formula (10).

$$Q_{Tn} = \frac{\rho C_p}{c_{22} \alpha_{22}^2 \Theta_o} \cdot \frac{1 + \left(\frac{f_n}{f_{m0}}\right)^2}{\frac{f_n}{f_{m0}}} \quad (10)$$

In the formula (10), $\rho$ represents mass density [kg/m$^3$], $c_{22}$ represents elastic stiffness constant [N/m$^2$] related to construction and expansion of the vibrating arm in the length direction, $\alpha_{22}$ represents thermal expansion coefficient [1/K] related to the vibrating arm in the length direction, Cp represents thermal capacity [J/(kg·K)], and $\Theta_0$ represents an absolute temperature [K] in the environment. Therefore, the parts represented by the following formula (A) in the formula (10) are constant numbers.

If 1 is used instead of n in the formula (10), a relational expression in the fundamental flexural vibration mode is obtained.

$$\frac{\rho C_p}{c_{22} \alpha_{22}^2 \Theta_o} \quad (A)$$

With the formula (10), a ratio of the Q value ($Q_{Tn}$) which is acquired by considering only the thermoelastic loss in the n-th harmonic flexural vibration mode and a Q value ($Q_{T1}$) which is acquired by considering only the thermoelastic loss in the fundamental flexural vibration mode can be represented by the following formula (11).

$$\frac{Q_{Tn}}{Q_n} = \frac{1+\left(\frac{f_n}{f_{m0}}\right)^2}{\frac{f_n}{f_{m0}}} \cdot \frac{\frac{f_1}{f_{m0}}}{1+\left(\frac{f_1}{f_{m0}}\right)^2} = \frac{f_1}{f_n} \cdot \frac{1+\left(\frac{f_n}{f_{m0}}\right)^2}{1+\left(\frac{f_1}{f_{m0}}\right)^2} = \frac{f_1}{f_n} \cdot \frac{f_{m0}^2 + f_n^2}{f_{m0}^2 + f_1^2} \quad (11)$$

Herein, in a case of the resonator element 2 which is created by using the Z-cut quartz crystal plate and a direction in which the vibrating arm 5 extends is the Y axis direction and a direction of the flexural vibration is mainly the X axis direction, since the mass density ρ thereof is 2649 [kg/m³], the thermal conductivity k ($k_{11}$) related to the vibration direction at the time of the flexural vibration is 6.65, and the thermal capacity Cp is 735.4 [J/(kg·K)], the following formula (12) is obtained by substituting the numerical values into the formula (4).

$$f_{m0} = \frac{\pi \times 6.65}{2 \times 2649 \times 735.4 \times a^2} \text{[Hz]} \quad (12)$$

The resonance frequency in the fundamental flexural vibration mode is not limited, but in a case where the resonator element 2 vibrates at a resonance frequency of 32.768 kHz ($f_1$=32.768 kHz) in the fundamental flexural vibration mode, for example, a region in which the width (effective width) a of the vibrating arm 5 in the vibration direction is greater than 12.8 μm is the heat insulating region. Accordingly, in the resonator element 2, the thermoelastic loss increases and the $f_{m0}$ decreases. Herein, when 27.0 [μm] as a being the heat insulating region is substituted to the formula (12), the $f_{m0}$ is 7.4 kHz and $f_{m0}^2/f_1^2$ is calculated as 0.05, and thus approximation such as the following formula (13) is satisfied.

$$f_{m0}^2 + f_1^2 = f_1^2\left(\frac{f_{m0}^2}{f_1^2} + 1\right) \approx f_1^2 \quad (13)$$

The resonance frequency $f_n$ in the n-th harmonic flexural vibration mode has a relationship of $f_1 < f_n$, and thus a relationship of the following formula (13') is satisfied in the same manner as the formula (13).

$$f_{m0}^2 + f_n^2 = f_n^2\left(\frac{f_{m0}^2}{f_n^2} + 1\right) \approx f_n^2 \quad (13')$$

If the value of a is large, the $f_{m0}$ is further smaller than 7.4 kHz, and therefore, in a case where the resonance frequency in the fundamental flexural vibration mode is 32.768 kHz, the formula (13) and the formula (13') are constantly satisfied in the range of a ≥27.0 [μm]. In the same manner as described above, in a case where the resonance frequency in the fundamental flexural vibration mode is 32.768 kHz and the flexural vibration direction of the vibrating arm 5 in the flexural vibration mode is the Y axis direction, the formula (13) and the formula (13') are obtained in the range of a ≥30.5 [μm], and in a case of the flexural vibration direction thereof is the Z axis direction, the formulae are obtained by setting the range of a ≥33.7 [m].

Accordingly, the formula (11) becomes the following formula (14).

$$\frac{Q_{Tn}}{Q_{T1}} \approx \frac{f_n}{f_1} \quad (14)$$

If the formula (14) is transformed to the following formula (15) and is substituted to the formula (9), the following formula (16) is obtained.

$$Q_{Tn} \approx \frac{f_n}{f_1} Q_{T1} \quad (15)$$

$$\frac{\left(\frac{f_n}{f_1} Q_{T1}\right)^{-1} + Q_{Ln}^{-1}}{Q_{T1}^{-1} + Q_{L1}^{-1}} > \frac{f_n C_n}{f_1 C_1} \quad (16)$$

If the formula (16) is subsequently transformed, the following formula (17) can be obtained.

$$\frac{\frac{f_1}{f_n} Q_{L_1} + \frac{Q_{L1}}{Q_{Ln}} Q_{T1}}{Q_{T_1} + Q_{L1}} > \frac{f_n C_n}{f_1 C_1} \quad (17)$$

$$\frac{Q_{L1}}{Q_{Ln}} Q_{T1} > \frac{f_n C_n}{f_1 C_1}(Q_{L1} + Q_{T1}) - \frac{f_1}{f_n} Q_{L_1}$$

$$\frac{Q_{L1}}{Q_{Ln}} > \frac{f_n C_n}{f_1 C_1}\left(\frac{Q_{L_1}}{Q_{T1}} + 1\right) - \frac{f_1}{f_n} \frac{Q_{L_1}}{Q_{T1}}$$

The general resonator element is designed to preferably satisfy $Q_{T1}/Q_{L1} \leq 0.05$, so as to sufficiently reduce the vibration leakage in the fundamental flexural vibration mode. Accordingly, $Q_{L1} > Q_{T1}$ can be satisfied. Thus, $Q_{L1}/Q_{T1}$ becomes an extremely large value, and $Q_{L1}/Q_{T1}+1 \approx Q_{L1}/Q_{T1}$ can be assumed. Therefore, the following formula (18) can be obtained by the formula (17).

$$Q_{Ln}^{-1} > Q_{T1}^{-1}\left(\frac{f_n C_n}{f_1 C_1} - \frac{f_1}{f_n}\right) \quad (18)$$

An equivalent capacitance $C_n$ in the n-th harmonic flexural vibration mode can be represented by the following formula (19).

$$C_n = \frac{1}{\omega_n^2 L_n} \quad (19)$$

The following formula (20) can be obtained by using the formula (19) and the formula (18).

$$Q_{Ln} < Q_{T1} \frac{f_n}{f_1}\left(\frac{L_1}{L_n} - 1\right)^{-1} \quad (20)$$

As described above, since it is designed that the vibration leakage is sufficiently reduced in the fundamental flexural vibration mode, and $Q_{L1} > Q_{T1}$ can be satisfied, $Q_{T1} = Q_1$ can be assumed by the formula (7). Accordingly, in the formula (20), the $Q_{T1}$ can be substituted with the $Q_1$, and the formula (1)

regulated in the invention can be introduced. The Q value ($Q_{Ln}$) acquired by considering only the vibration leakage in an n-th harmonic flexural vibration mode can be actually measured as follows. First, the Q value of the resonator element 2, in a state of being connected to the base 91 through the conductive adhesive 11, which is the resonator 1, in the n-th harmonic flexural vibration mode is measured and this value is set as $Q_a$. Then, the resonator element 2 which is not connected to the base 91 through the conductive adhesive 11 is prepared, and is fixed to the connection terminals 951 and 961 of the base 91 in a state where the element 2 is suspended by a metallic wire such as Au, Al, or Cu. At that time, the conductive adhesive 11 may be connected or may not be connected to the resonator element 2, and alternatively, a part of the conductive adhesive 11 may remain to be connected to the resonator element 2. This is because that, since the conductive adhesive 11 in this state is not connected to the base 91, the elastic energy does not leak to the outside through the conductive adhesive 11 in the n-th harmonic flexural vibration mode, accordingly the loss is not concerned and the deformation is also extremely small, and therefore only the equivalent series resistance $R_n$ is slightly increased.

The wire on the element 2 side is connected to the region to which the least effect of the vibration is affected in the element 2, that is, the support arm 71. In a case of the resonator element with no support arm, the wire is connected to the vicinity of the region in which the fixing portion should be provided, such as a base portion. In addition, the wire preferably has sufficient fineness and a length so that the n-th flexural vibration of the resonator element 2 does not leak, and for example, a diameter thereof is preferably from 5 μm to 30 and the length is preferably from 1.5 to 5 times with respect to the length of the resonator element 2 in the Y axis direction. The Q value measured in this state in the n-th harmonic flexural vibration mode is $Q_b$. According to the formula (7), since $Q_a^{-1}=Q_{Tn}^{-1}+Q_{Ln}^{-1}$ and $Q_b^{-1}=Q_{Tn}^{-1}$, $Q_{Ln}=(Q_a^{-1}-Q_b^{-1})^{-1}$ is obtained by the two formulae.

The measurement can be performed in the same manner as described above even in a case where the fixing portion is not the conductive adhesive. Other methods may be used as long as it is a method which is not affected by the vibration leakage, and only the $Q_a$ may be measured and $Q_{Tn}$ may be calculated by the simulating using a model obtained by patterning the shape of the resonator element 2 to obtain $Q_{Ln}=(Q_a^{-1}-Q_{Tn}^{-1})^{-1}$ by the formula (7).

As described above, it is preferable that the resonator element 2 configured so as to satisfy the formula (1) is configured so as to satisfy at least one (preferably two and more preferably three) of the following three conditions [1] to [3].

[1] $Q_{Ln}^{-1}/Q_n^{-1}$ is preferably equal to or greater than 0.5 and more preferably equal to or greater than 0.9. Accordingly, a proportion of the loss by the vibration leakage with respect to the entire loss of the resonator element 2 in the n-th harmonic flexural vibration mode can be sufficiently set to be great. Since the thermoelastic loss in the n-th harmonic flexural vibration mode is naturally determined by the shape of the vibrating arms 5 and 6 which are optimally designed in the fundamental flexural vibration mode, by satisfying the conditions, it is possible to sufficiently decrease the Q value in the n-th harmonic flexural vibration mode. As a result, it is possible to set the equivalent series resistance $R_2$ in the n-th harmonic flexural vibration mode to be greater than the equivalent series resistance $R_1$ in the fundamental flexural vibration mode, and therefore, it is possible to obtain the resonator 1 which exhibits a more excellent vibration property in the fundamental flexural vibration mode of the resonator element 2, and a concern of a false operation in which an oscillator with this resonator loaded thereon oscillates at a resonance frequency in the n-th harmonic flexural vibration mode, is reduced.

[2] $Q_n/Q_1$ is preferably equal to or smaller than 1, more preferably equal to or smaller than 0.5, and even more preferably equal to or smaller than 0.3. That is, it is preferable to set $Q_1$ to be sufficiently greater than $Q_n$. Accordingly, it is possible to set the equivalent series resistance $R_n$ in the n-th harmonic flexural vibration mode to be sufficiently greater than the equivalent series resistance $R_1$ of the resonator element 2 in the fundamental flexural vibration mode. As a result, it is possible to obtain the resonator 1 which exhibits a more excellent vibration property in the fundamental flexural vibration mode of the resonator element 2.

[3] $f_{m0}^2/f_1^2$ is preferably equal to or smaller than 0.05, more preferably equal to or smaller than 0.001, and even more preferably equal to or smaller than 0.0001. For example, in a case where $f_{m0}^2/f_1^2=0.05$, as shown in Table 1 below, the Q value ($Q_1$) in the fundamental flexural vibration mode is sufficiently increased with respect to a Q value of 802 when $f_1=f_{m0}$ in which the thermoelastic loss becomes the maximum.

TABLE 1

| | |
|---|---|
| ρ [kg/m³] | 2649 |
| Cp [J/(kg · K)] | 734.5 |
| $C_{22}$ [N/m²] | 8.67E+10 |
| $α_{22}$ [1/K] | 1.37E−05 |
| $Θ_0$ [K] | 298.15 |
| $f_{m0}^2/f_1^2$ | 0.05 |
| $f_1/f_{mo}$ | 4.472136 |
| $Q_1$ | 1883 |

If $f_{m0}^2/f_1^2$ is smaller than 0.05, the Q value ($Q_1$) in the fundamental flexural vibration mode is further increased. Accordingly, by satisfying that $f_{m0}^2/f_1^2 \leq 0.05$, it is possible to obtain the resonator element 2 having a high Q value. That is, it is possible to obtain the resonator element 2 having low equivalent series resistance $R_1$ in the fundamental flexural vibration mode. As a result, it is possible to obtain the resonator 1 which exhibits the excellent vibration property at low power consumption in the fundamental flexural vibration mode of the resonator element 2.

If the width of the vibrating arm 5 (length in the X axis direction) is set as $a_0$, and the value of $f_{m0}$ obtained by substituting $a_0$ with the effect arm width a of the formula (4), thermal relaxation frequency in a case where the grooves 52 and 53 are not formed on the front and rear surfaces of the vibrating arm 5 is obtained. The thermal relaxation frequency $f_m$ in a case where the grooves 52 and 53 are formed is $f_{m0}$ obtained by substituting the effective arm width a in the formula (4) ($f_m=f_{m0}$), in addition, in the heat insulating region as described above, the thermal relaxation frequency $f_m$ in a case where the grooves 52 and 53 are formed is lower than the thermal relaxation frequency $f_0$ in a case where the grooves 52 and 53 are not formed, that is, $f_{m0}<f_0$. Accordingly, by satisfying $f_0^2/f_1^2 \leq 0.05$, $f_{m0}^2/f_1^2 \leq 0.05$ is satisfied, and accordingly, by satisfying $f_0^2/f_1^2 \leq 0.05$, it is possible to obtain the resonator element 2 having a higher Q value.

According to the study by the inventors, it is confirmed that, in the resonator element 2 described above, the vibration in the second harmonic flexural vibration mode and the vibration in the third harmonic flexural vibration mode among the vibration in various harmonic flexural vibration modes greatly affect the vibration in the fundamental flexural vibration mode. Herein, the second harmonic flexural vibration mode is a harmonic flexural vibration mode having a low resonance frequency subsequent to that in the fundamental flexural vibration mode, and is a vibration mode in which, when the base portion 4 side of the vibrating arms 5 and 6 repeats between approach and separation from each other in the approximately XY plane, the flexural vibration in which the distal end side (side opposite the base portion 4) of the vibrating arms 5 and 6 repeats between approach and separation from each other is performed, and as shown in FIG. 8A, the vibrating arms 5 and 6 bend around one middle portion in the longitudinal direction. The third harmonic flexural vibration mode is a harmonic flexural vibration mode having a low resonance frequency subsequent to that in the second harmonic flexural vibration mode, and is a vibration mode in which, when the base portion 4 side and the distal end side of the vibrating arms 5 and 6 repeat between approach and separation from each other in the approximately XY plane, the flexural vibration in which portions of the vibrating arms 5 and 6 positioned between the base portion 4 side and the distal end side of the vibrating arms 5 and 6 repeat between approach and separation from each other is performed, and as shown in FIG. 8B, the vibrating arms 5 and 6 bend around two middle portions in the longitudinal direction in a S shape.

Accordingly, in the invention, the resonator element 2 is preferably configured so as to satisfy the following formula (2) or the following formula (3). Therefore, the vibration mode including the second harmonic flexural vibration mode or the vibration mode including the third harmonic flexural vibration mode is included in a mixed manner in the vibration of the resonator element 2 in the fundamental flexural vibration mode, and it is possible to suitably prevent the decrease in the vibration property of the resonator element 2.

$$Q_{L2} < Q_1 \frac{f_2}{f_1}\left(\frac{L_1}{L_2} - 1\right)^{-1} \quad (2)$$

$$Q_{L3} < Q_1 \frac{f_3}{f_1}\left(\frac{L_1}{L_3} - 1\right)^{-1} \quad (3)$$

The effects described above will be described in detail with reference to results of a simulation performed by the inventors. In the simulation, the resonator element 2 and a resonator element X which are obtained by patterning the Z-cut quartz crystal plate by the wet etching are used.

As dimensions of portions of the resonator element 2 used in the simulation, a thickness of the quartz crystal substrate 3 is 130 μm, a depth of the grooves 62 and 63 is 60 μm, and the other dimensions are as shown in FIG. 7A. The resonator element X shown in FIG. 7B is substantially the same as the resonator element 2 shown in FIG. 7A, except for omitting the reduced width portion 42 and the support arm 71.

The simulation was performed for the case where the resonator element 2 and the resonator element X adhered to the base (Young's modulus: 320 GPa, Poisson's ratio: 0.23, mass density: 3800 kg/m³) at two portions by using bismuth-raid Adhesive (Young's modulus: 3.4 GPa, Poisson's ratio: 0.33, mass density: 4070 kg/m³) having a thickness of 20 μm. The resonator element 2 is fixed to the base at the support arm 71, and the resonator element X is fixed to the base at the base portion (lower end portion in FIG. 7B), and the loss occurring by the leakage of energy reaching the interface between the adhesive and the base to the base side is calculated as the vibration leakage, and a corrected coefficient obtained from the measured result is multiplied, and accordingly a Q value ($Q_{L2}$) acquired by considering only the vibration leakage in the second harmonic flexural vibration mode is obtained.

The simulation was performed for the resonator element 2 and the resonator element X, and the property values in the fundamental flexural vibration mode and the second harmonic flexural vibration mode were calculated. Hereinafter, the calculated results are shown in Table 2 below.

TABLE 2

|  |  | Resonator element 2 | Resonator element X |
|---|---|---|---|
| Fundamental flexural vibration mode | $R_1$ [kΩ] | 65 | 136 |
|  | $f_1$ [Hz] | 31061 | 31962 |
|  | $L_1$ [H] | 2588 | 2795 |
|  | $Q_1$ | 9834 | 10107 |
| Second harmonic flexural vibration mode | $R_2$ [kΩ] | 149.5 | 108.8 |
|  | $f_2$ [Hz] | 281395 | 290610 |
|  | $L_2$ [H] | 121 | 1715 |
|  | $Q_{L2}$ | 1816 | 180411 |
| Value calculated by substituting property values into a right side of the formula (2) |  | 4383 | 145945 |
| $R_2/R_1$ |  | 2.3 | 0.8 |

As is clear from Table 2, in the resonator element 2, a value calculated by substituting the property values obtained by the simulation into a right side of the formula (2) is 4383 and it is larger than the value (1816) of $Q_{L2}$ which is on a left side of the formula (2). That is, the resonator element 2 is configured so as to satisfy the formula (2). In addition, a ratio $R_2/R_1$ of the equivalent series resistance $R_1$ in the fundamental flexural vibration mode and the equivalent series resistance $R_2$ in the second harmonic flexural vibration mode is 2.3, and $R_2$ is sufficiently larger than $R_1$. Accordingly, the resonator 1 including such a resonator element 2 can exhibit the excellent vibration property, and the occurrence of the false operation in which the oscillator on which the resonator 1 including such a resonator element 2 is loaded, oscillates at the resonance frequency in the second harmonic flexural vibration mode can be suppressed.

On the other hand, in the resonator element X, a value calculated by substituting the property values obtained by the simulation into a right side of the formula (2) is 145945, and it is smaller than the value (180411) of $Q_{L2}$ which is on a left side of the formula (2). That is, the resonator element X is not configured so as to satisfy the formula (2). In addition, the ratio $R_2/R_1$ of the equivalent series resistance $R_1$ in the fundamental flexural vibration mode and the equivalent series resistance $R_2$ in the second harmonic flexural vibration mode is 0.8, and $R_1$ is sufficiently larger than $R_2$. Accordingly, the false operation in which the oscillator on which the resonator including such a resonator element X is loaded, oscillates at the resonance frequency in the second harmonic flexural vibration mode may occur.

According to the study by the inventors, when n=3, that is, also in the third harmonic flexural vibration mode, the same effect as the simulation effect obtained in the second harmonic flexural vibration mode is obtained.

As described above, by configuring (designing) the resonator element 2 so as to satisfy the formula (1) regulated in the invention, it is possible to suppress the increase of the equivalent series resistance $R_1$ in the fundamental flexural vibration mode, and to set a value of equivalent series resistance $R_n$ in the n-th harmonic flexural vibration mode to be greater than the value of the equivalent series resistance $R_1$ in the fundamental flexural vibration mode. As a result, it is possible to obtain the resonator 1 which exhibits an excellent vibration property, and to suppress the occurrence of the false operation in which the oscillator with the resonator 1 loaded thereon oscillates at the resonance frequency in the n-th harmonic flexural vibration mode.

2. Oscillator

Next, the oscillator to which the resonator of the invention is applied (oscillator according to the invention) will be described.

Figure 9:
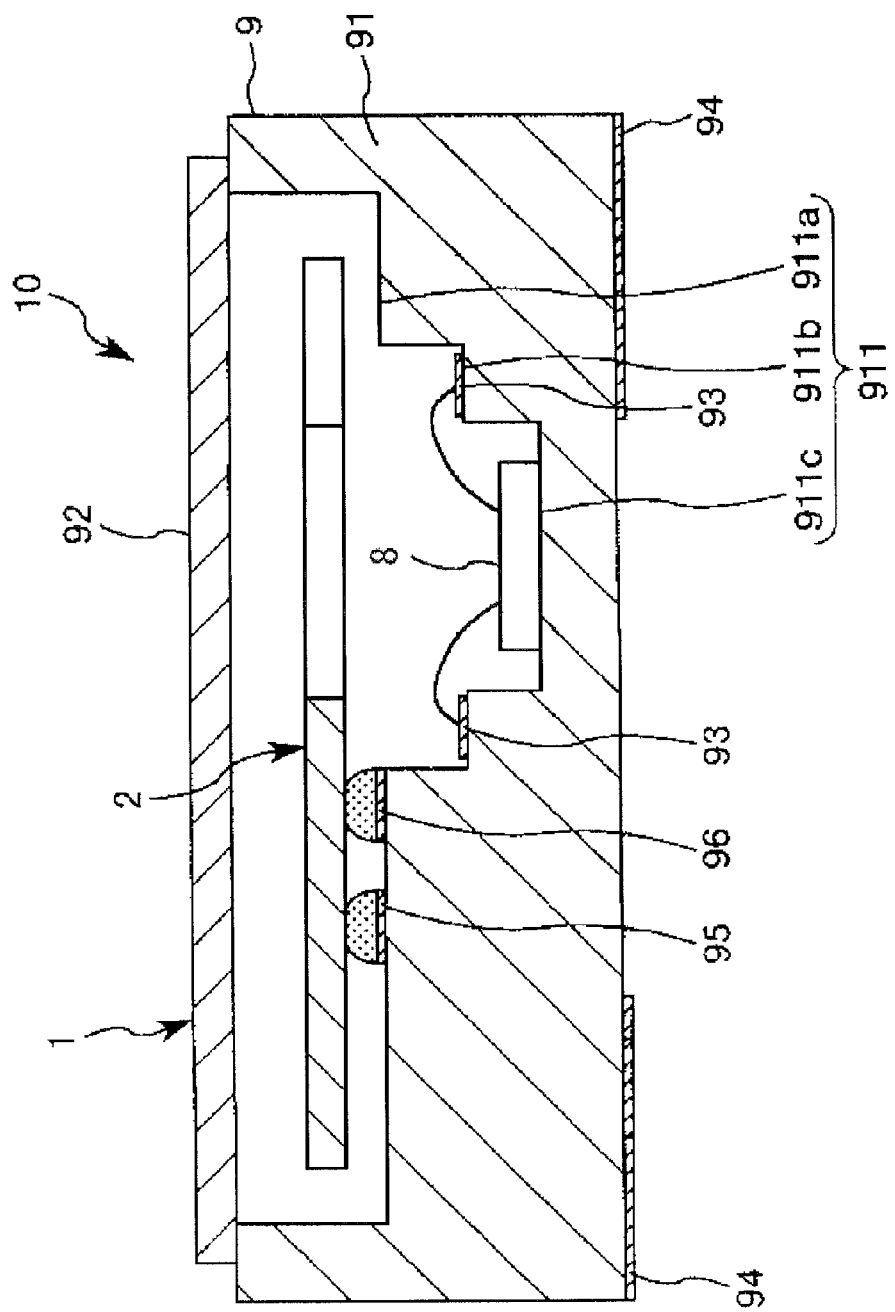
FIG. 9 is a cross-sectional view showing a preferred embodiment of an oscillator according to the invention.

FIG. 9 is a cross-sectional view showing a preferred embodiment of the oscillator according to the invention.

An oscillator 10 shown in FIG. 9 includes the resonator 1, and an IC chip 8 for driving the resonator element 2. Hereinafter, the oscillator 10 will be described with a focus on different points from the resonator, and the description of the overlapping points will be omitted.

As shown in FIG. 9, the package 9 includes the box-shaped base 91 including the recess 911, and the plate-shaped lid 92 which covers the opening of the recess 911. In addition, the recess 911 of the base 91 includes a first recess 911a opened to an upper surface of the base 91, a second recess 911b opened to a center portion of a bottom surface of the first recess 911a, and a third recess 911c opened to a center portion of a bottom surface of the second recess 911b.

The connection terminals 95 and 96 are formed on the bottom surface of the first recess 911a. The IC chip 8 is disposed on the bottom surface of the third recess 911c. The IC chip 8 includes an oscillation circuit for controlling the driving of the resonator element 2. If the resonator element 2 is driven by the IC chip 8, it is possible to extract a signal at a predetermined frequency.

In addition, a plurality of internal terminals 93 electrically connected to the IC chip 8 through a wire are formed on the bottom surface of the second recess 911b. The plurality of the internal terminals 93 include a terminal which is electrically connected to an external terminal 94 formed on the bottom surface of the package 9 through a via (not shown) formed on the base 91, a terminal which is electrically connected to the connection terminal 95 through a via or wire (not shown), and a terminal which is electrically connected to the connection terminal 96 through a via or wire (not shown).

In the configuration of FIG. 9, the configuration in which the IC chip 8 is disposed in the accommodation space has been described, but the disposition of the IC chip 8 is not particularly limited, and the IC chip may be disposed on the outside of the package 9 (bottom surface of the base), for example.

3. Electronic Device

An electronic device to which the resonator according to the invention is applied (electronic device according to the invention) will be described.

Figure 11:
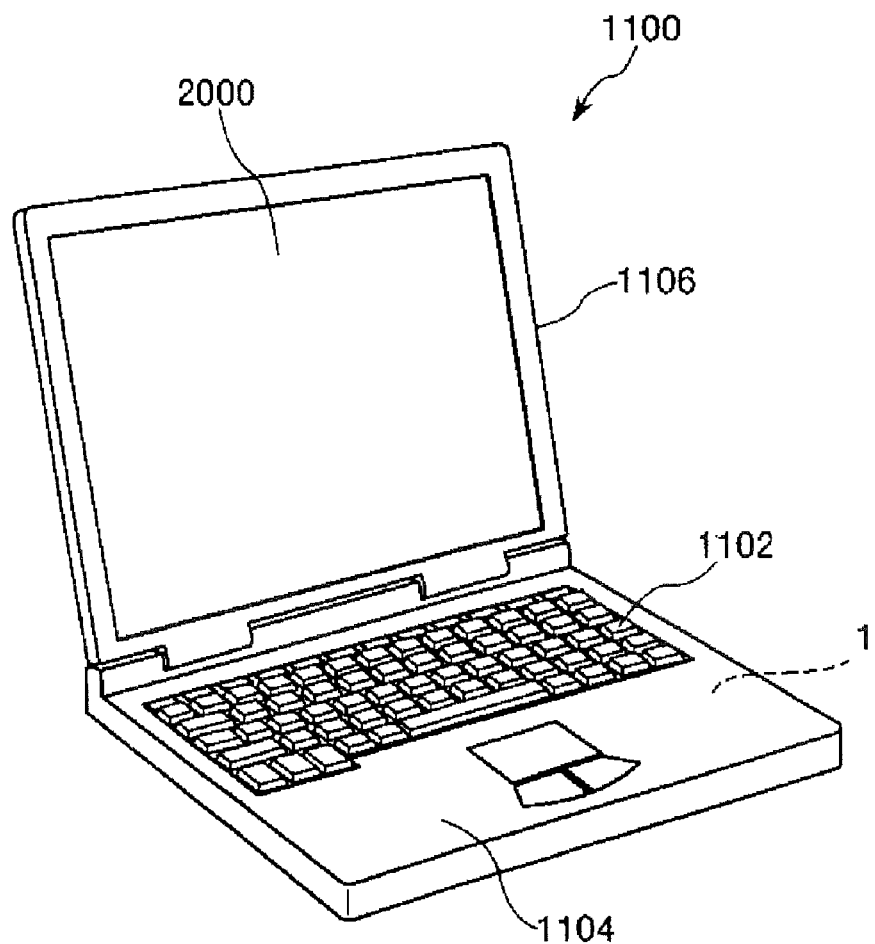
FIG. 11 is a perspective view showing a configuration of a mobile-type (or note-type) personal computer to which an electronic device including a resonator according to the invention is applied.

FIG. 11 is a perspective view showing a configuration of a mobile-type (or note-type) personal computer to which the electronic device including the resonator according to the invention is applied. In the drawing, a personal computer 1100 is configured with a main body portion 1104 including a keyboard 1102, and a display unit 1106 including a display portion 2000, and the display unit 1106 is rotatably supported with respect to the main body portion 1104 through a hinge structure portion. The resonator element 2 which functions as a filter, a resonator, or a reference clock is embedded in such personal computer 1100.

Figure 10:
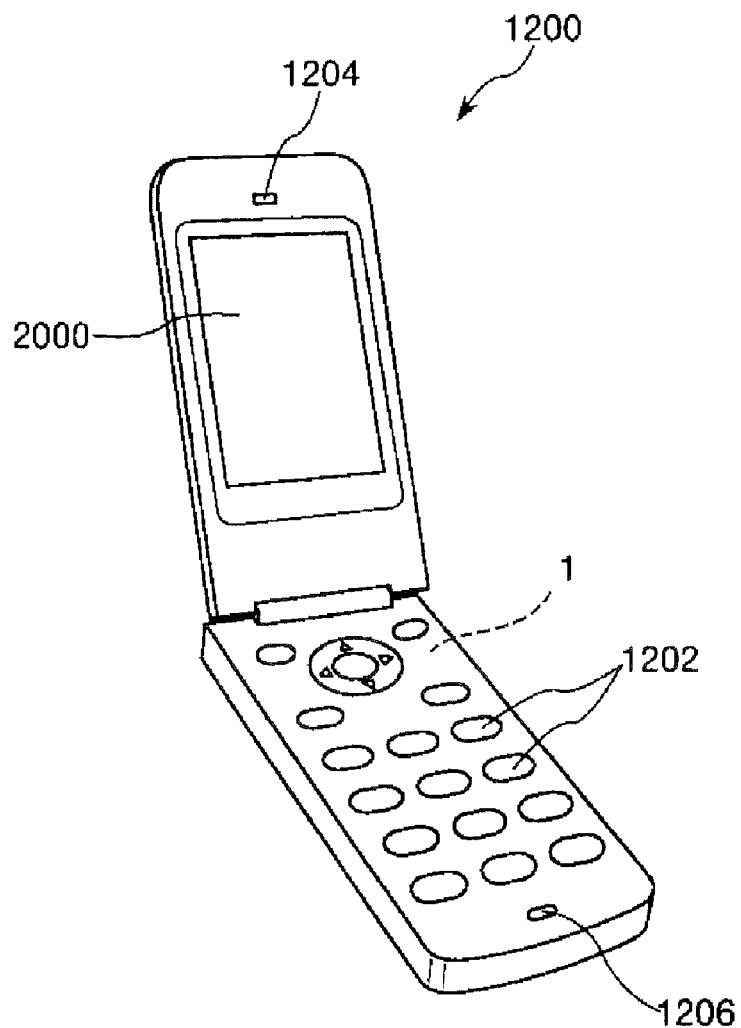
FIG. 10 is a perspective view showing a configuration of a mobile phone (including a PHS) to which an electronic device including a resonator according to the invention is applied.

FIG. 10 is a perspective view showing a configuration of a mobile phone (including a PHS) to which the electronic device including the resonator according to the invention is applied. In the drawing, a mobile phone 1200 includes a plurality of manipulation buttons 1202, an ear piece 1204, and a mouth piece 1206, and a display portion 2000 is disposed between the manipulation buttons 1202 and the ear piece 1204. The resonator element 2 which functions as a filter or a resonator is embedded in such mobile phone 1200.

Figure 12:
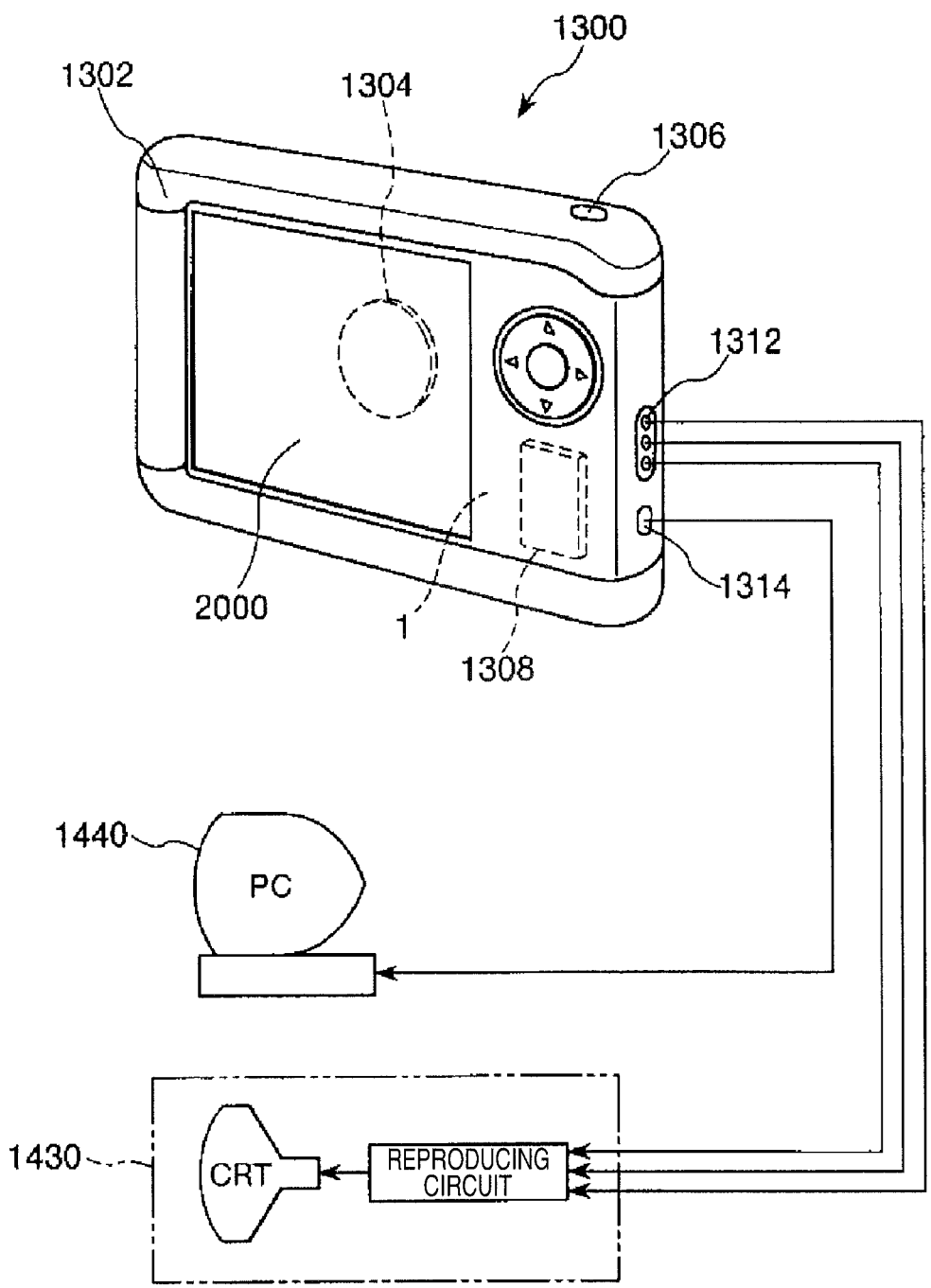
FIG. 12 is a perspective view showing a configuration of a digital still camera to which an electronic device including a resonator according to the invention is applied.

FIG. 12 is a perspective view showing a configuration of a digital still camera to which the electronic device including the resonator according to the invention is applied. In the drawing, the connection with an external device is simply shown. Herein, a digital still camera 1300 generates an imaging signal (image signal) by performing photoelectric conversion of an optical image of a subject by an imaging device such as a charge coupled device (CCD), whereas a typical camera exposes a silver-halide photographic film with an optical image of a subject.

A display unit is provided on a rear surface of a case (body) 1302 of the digital still camera 1300, and has a configuration of performing display based on the imaging signal by the CCD, and the display unit functions as a finder for displaying a subject as an electronic image. In addition, a light receiving unit 1304 including an optical lens (imaging optical system) or the CCD is provided on a front surface side (rear surface side in the drawing) of the case 1302.

When a photographer confirms a subject image displayed on the display unit and presses a shutter button 1306, the image signal of the CCD at that time point is transferred and stored in the memory 1308. In addition, in the digital still camera 1300, a video signal output terminal 1312 and a data communication input and output terminal 1314 are provided on a side surface of the case 1302. As shown in the drawing, a television monitor 1430 is connected to the video signal output terminal 1312 and a personal computer 1440 is connected to the data communication input and output terminal 1314, respectively, if necessary. In addition, the imaging signal stored in the memory 1308 is output to the television monitor 1430 or the personal computer 1440 by a predetermined manipulation. The resonator element 2 which functions as a filter or a resonator is embedded in such digital still camera 1300.

In addition to the personal computer of FIG. 11 (mobile type personal computer), the mobile phone of FIG. 10, and the digital still camera of FIG. 12, the electronic device including the resonator according to the invention can be applied to an ink jet-type discharging device (for example, ink jet printer), a laptop type personal computer, a television, a video camera, a video tape recorder, a car navigation device, a pager, an electronic notebook (including communication function), an electronic dictionary, a calculator, an electronic game machine, a word processor, a workstation, a video telephone, a security television monitor, an electronic binocular, a POS terminal, medical equipment (for example, an electronic thermometer, a blood pressure meter, a blood glucose meter, an ECG measuring device, a ultrasound diagnostic device, an electronic endoscope), a fish finder, a variety of measurement equipment, a meter (for example, meters for vehicles, aircraft, ships), a flight simulator, and the like.

4. Moving Object

Next, a moving object to which the resonator according to the invention is applied (moving object according to the invention) will be described.

Figure 13:
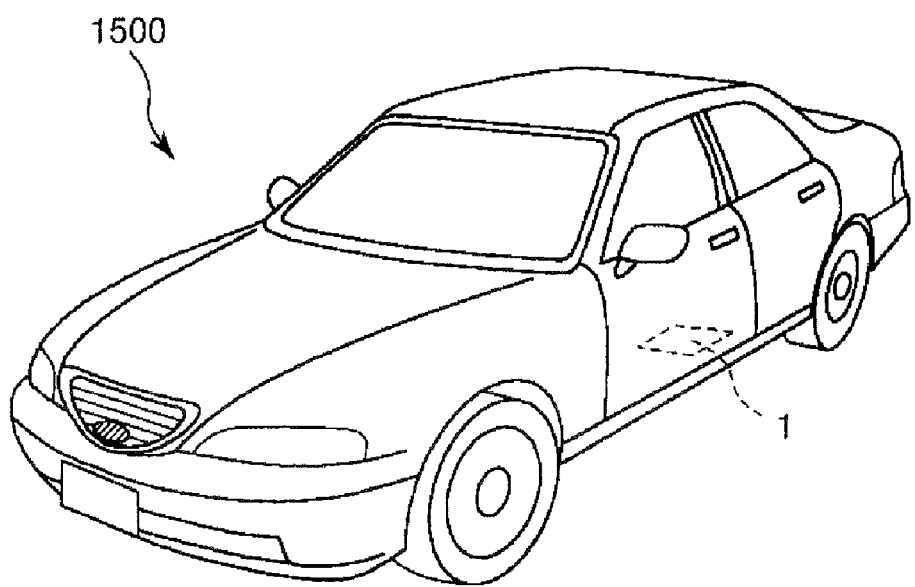
FIG. 13 is a perspective view schematically showing a vehicle as an example of a moving object according to the invention.

FIG. 13 is a perspective view schematically showing a vehicle as an example of a moving object according to the invention. The resonator element 2 is loaded on a vehicle 1500. The resonator element 2 can be widely applied to an electronic control unit (ECU) such as a keyless entry, an immobilizer, a car navigation system, a car air-conditioner, an anti-lock braking system (ABS), an airbag, a tire pressure monitoring system (TPMS), engine control, a battery monitor of a hybrid car or an electrical car, a vehicle body posture control unit, and the like.

Hereinabove, the resonator element, the resonator, the oscillator, the electronic device, and the moving object have been described with reference to the embodiments shown in the drawings, but the invention is not limited thereto, and the configuration of each unit can be replaced by an arbitrary configuration having the same function. Other arbitrary configurations may be added to the invention. In addition, embodiments may be suitably combined with each other.

The entire disclosure of Japanese Patent Application No. 2013-075384, filed Mar. 29, 2013 is expressly incorporated by reference herein.

What is claimed is:

1. A resonator element comprising:
   a vibration piece including a base portion, and a pair of vibrating arms which, in a plan view, extend in a first direction from the base portion, are arranged in a second direction orthogonal to the first direction, and alternately repeat between approach and separation from each other along the second direction to perform flexural vibration,
   wherein conditions shown by the following formula (1) are satisfied $$Q_{Ln} < Q_1 \frac{f_n}{f_1}\left(\frac{L_1}{L_n} - 1\right)^{-1} \quad (1)$$

wherein, $Q_{Ln}$ represents a Q value acquired by considering only vibration leakage in an n-th harmonic flexural vibration mode, $Q_1$ represents a Q value in a fundamental flexural vibration mode, $L_n$ represents equivalent inductance in the n-th harmonic flexural vibration mode, $L_1$ represents equivalent inductance in the fundamental flexural vibration mode, $f_n$ represents a resonance frequency in the n-th harmonic flexural vibration mode, $f_1$ represents a resonance frequency in the fundamental flexural vibration mode, and n represents a natural number of equal to or greater than 2.

2. The resonator element according to claim 1,
   wherein, when a Q value in an n-th harmonic flexural vibration mode is set as $Q_n$, $Q_{Ln}^{-1}/Q_n^{-1}$ is equal to or greater than 0.5.

3. The resonator element according to claim 1,
   wherein, when a Q value in an n-th harmonic flexural vibration mode is set as $Q_n$, $Q_n/Q_1$ is equal to or smaller than 1.

4. The resonator element according to claim 1,
   wherein, when a thermal relaxation frequency is set as $f_{m0}$, $f_{m0}^2/f_1^2$ is equal to or smaller than 0.05.

5. The resonator element according to claim 1, further comprising:
   a support arm which is disposed between the pair of vibrating arms in a plan view, and extends along the first direction from the base portion,
   wherein the support arm is attached to a base with a fixing material.

6. The resonator element according to claim 1,
   wherein a groove is provided on at least one of a pair of main surfaces of the vibrating arm which have a front-rear relationship.

7. The resonator element according to claim 1,
   wherein the vibrating arm includes a weight portion, and an arm portion which is disposed between the weight portion and the base portion in a plan view.

8. The resonator element according to claim 7,
   wherein the weight portion includes a wide width portion having a greater width along the second direction than that of the arm portion.

9. A resonator comprising:
   the resonator element according to claim 1; and
   a base on which the resonator element is loaded.

10. An oscillator comprising:
    the resonator element according to claim 1; and
    a circuit.

11. An electronic device comprising the resonator element according to claim 1.

12. A moving object comprising the resonator element according to claim 1.

* * * * *